US011631615B2

(12) United States Patent
Hu et al.

(10) Patent No.: US 11,631,615 B2
(45) Date of Patent: Apr. 18, 2023

(54) MICROELECTRONIC DEVICES INCLUDING CONTACT STRUCTURES WITH ENLARGED AREAS, AND RELATED ELECTRONIC SYSTEMS AND METHODS

(71) Applicant: Micron Technology, Inc., Boise, ID (US)

(72) Inventors: Yi Hu, Boise, ID (US); Kar Wui Thong, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/877,233

(22) Filed: May 18, 2020

(65) Prior Publication Data

US 2021/0358806 A1 Nov. 18, 2021

(51) Int. Cl.
*H01L 27/1157* (2017.01)
*H01L 27/11582* (2017.01)
(Continued)

(52) U.S. Cl.
CPC .. *H01L 21/76897* (2013.01); *H01L 21/31111* (2013.01); *H01L 23/535* (2013.01);
(Continued)

(58) Field of Classification Search
CPC ......... H01L 21/76897; H01L 21/31111; H01L 27/11556; H01L 27/1157; H01L 27/11524;
(Continued)

(56) References Cited

U.S. PATENT DOCUMENTS 9,490,262 B1  11/2016  Pang et al.
9,922,987 B1   3/2018  Mizutani et al.
(Continued)

FOREIGN PATENT DOCUMENTS

CN  107658306 A  2/2018

OTHER PUBLICATIONS

Greenlee et al., Tungsten Structures and Methods of Forming the Structures, U.S. Appl. No. 16/730,505, filed Dec. 30, 2019.

*Primary Examiner* — Didarul A Mazumder
*Assistant Examiner* — Gustavo G Ramallo
(74) *Attorney, Agent, or Firm* — TraskBritt

(57) ABSTRACT

A microelectronic device comprises a stack structure comprising alternating conductive structures and insulative structures arranged in tiers, each of the tiers individually comprising a conductive structure and an insulative structure, strings of memory cells vertically extending through the stack structure, the strings of memory cells comprising a channel material vertically extending through the stack structure, another stack structure vertically overlying the stack structure and comprising alternating levels of other conductive structures and other insulative structures, the other stack structure comprising pillars vertically overlying the strings of memory cells, each pillar comprising an other channel material in electrical communication with the channel material of the strings of memory cells, and conductive contact structures vertically overlying the other stack structure, each conductive contact structure comprising an electrically conductive contact at least partially extending into the pillars and a portion extending outside of the pillars having a larger cross-sectional area than the pillars. Related microelectronic devices including self-aligned conductive contact structures, and related electronic systems and methods are also described.

23 Claims, 18 Drawing Sheets

(51) Int. Cl.
*H01L 23/532* (2006.01)
*H01L 21/768* (2006.01)
*H01L 27/11524* (2017.01)
*H01L 27/11556* (2017.01)
*H01L 21/311* (2006.01)
*H01L 23/535* (2006.01)

(52) U.S. Cl.
CPC .... *H01L 23/53257* (2013.01); *H01L 27/1157* (2013.01); *H01L 27/11524* (2013.01); *H01L 27/11556* (2013.01); *H01L 27/11582* (2013.01)

(58) Field of Classification Search
CPC ......... H01L 27/11582; H01L 23/53257; H01L 23/535
See application file for complete search history.

(56) References Cited

U.S. PATENT DOCUMENTS

| | | | |
|---|---|---|---|
| 9,972,640 B1 | 5/2018 | Kai et al. | |
| 10,170,493 B1 | 1/2019 | Greenlee | |
| 10,242,995 B2 | 3/2019 | Zhu et al. | |
| 10,283,524 B1 | 5/2019 | Greenlee et al. | |
| 10,290,650 B1 | 5/2019 | Iwai | |
| 10,475,804 B1 | 11/2019 | Nishikawa et al. | |
| 2003/0011023 A1* | 1/2003 | Hurley | H01L 21/76897 257/315 |
| 2005/0133851 A1* | 6/2005 | Forbes | H01L 27/115 257/315 |
| 2009/0321943 A1* | 12/2009 | Meldrim | H01L 21/28556 257/770 |
| 2011/0104869 A1* | 5/2011 | Hyun | H01L 27/11575 438/430 |
| 2012/0280199 A1* | 11/2012 | Takagi | H01L 45/1683 257/3 |
| 2014/0001530 A1* | 1/2014 | Song | H01L 29/7926 257/314 |
| 2014/0264533 A1 | 9/2014 | Simsek-Ege et al. | |
| 2015/0348984 A1* | 12/2015 | Yada | H01L 27/11524 257/326 |
| 2015/0348989 A1 | 12/2015 | Pekny | |
| 2016/0071864 A1* | 3/2016 | Noda | H01L 27/11582 257/329 |
| 2016/0204122 A1* | 7/2016 | Shoji | H01L 27/11575 257/324 |
| 2016/0300848 A1 | 10/2016 | Pachamuthu et al. | |
| 2019/0067320 A1* | 2/2019 | Cho | H01L 23/5226 |
| 2019/0333581 A1 | 10/2019 | Diep et al. | |
| 2020/0343135 A1* | 10/2020 | Huang | H01L 21/28556 |
| 2021/0358890 A1* | 11/2021 | Hu | H01L 25/0657 |

* cited by examiner

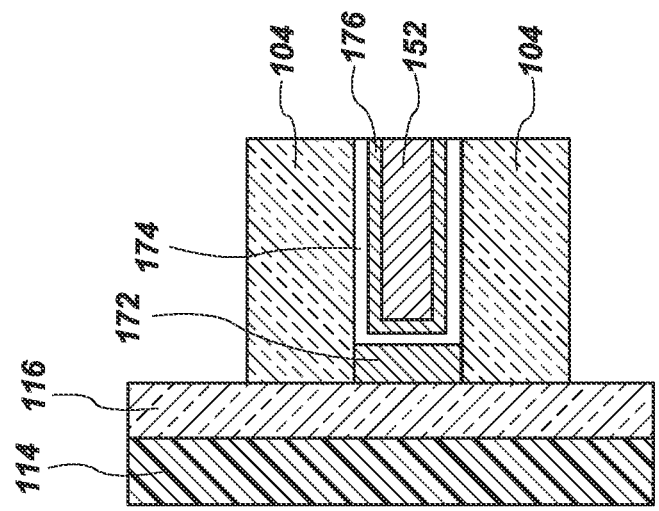
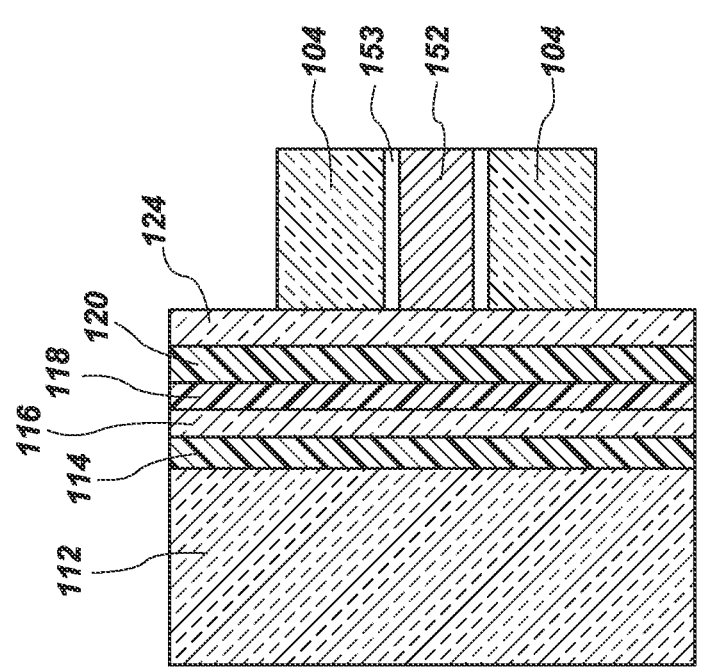
FIG. 1P
FIG. 1O

MICROELECTRONIC DEVICES INCLUDING CONTACT STRUCTURES WITH ENLARGED AREAS, AND RELATED ELECTRONIC SYSTEMS AND METHODS

TECHNICAL FIELD

The disclosure, in various embodiments, relates generally to the field of microelectronic device design and fabrication. More specifically, the disclosure relates to microelectronic devices and apparatuses including self-aligned contact structures having an enlarged area, and to related electronic systems and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in a stack of tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., the word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the number of tiers of the conductive structures increases, processing conditions of the formation of aligned contacts to various components of the microelectronic device becomes increasingly difficult. In addition, other technologies to increase memory density have reduced the spacing between adjacent vertical memory strings. However, reducing the spacing between adjacent vertical memory strings may increase a difficulty of forming individual electrical connections to the vertical memory strings without shorting to adjacent vertical memory strings.

DETAILED DESCRIPTION

Figure 1A:
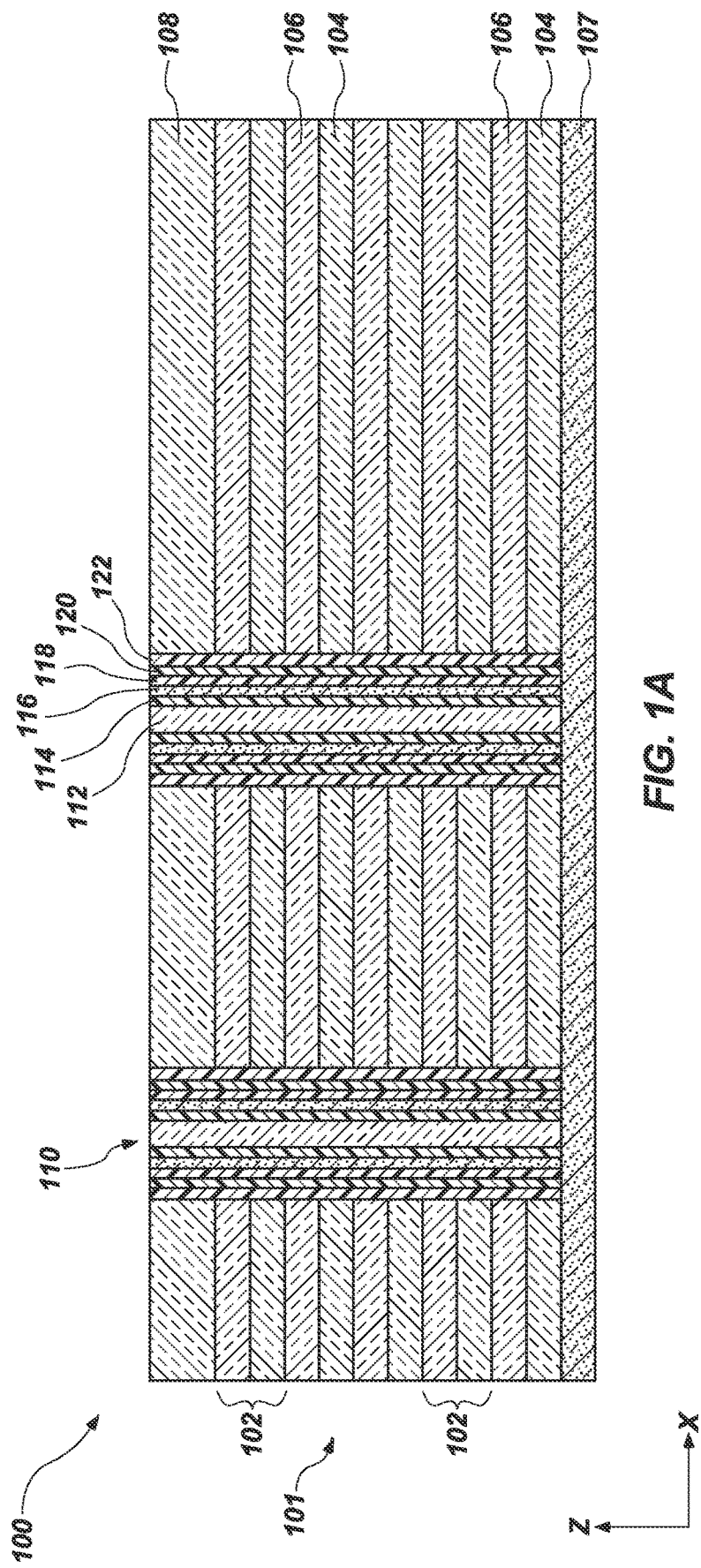
FIG. 1A through FIG. 1N are simplified cross-sectional views (FIG. 1A, FIG. 1C, FIG. 1D, FIG. 1F, FIG. 1G, FIG. 1I, FIG. 1K, FIG. 1L, FIG. 1M, and FIG. 1N) and top views (FIG. 1B, FIG. 1E, FIG. 1H, and FIG. 1J) illustrating a method of forming a microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as DRAM memory device), apparatus, or electronic system, or a complete microelectronic device, apparatus, or electronic system including self-aligned contact structures having a relatively larger lateral dimension (e.g., area, cross-sectional area) relative to vertical memory strings or pillars associated with the contact structures. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "memory device" means and includes microelectronic devices exhibiting memory functionality, but not necessary limited to memory functionality. Stated another way, and by way of example only, the term "memory device" means and includes not only conventional memory in the form of DRAM, NAND, etc., but also by way of example only, an application specific integrated circuit (ASIC) (e.g., a system on a chip (SoC)), a microelectronic device combining logic and memory, or a graphics processing unit (GPU) incorporating memory.

According to embodiments described herein, a microelectronic device comprises a stack structure comprising alternating conductive structures and insulative structures arranged in tiers, each tier comprising a conductive structure and an insulative structure. Strings of memory cells may extend through the stack structure and may comprise, for example, a channel material extending through the stack structure. Memory cells of the strings of memory cells may be located at intersections between the conductive structures and the channel material, adjacent memory cells of each string being separated from each other by one of the insulative structures. In some embodiments, the strings may include strings that are laterally aligned with each other and at least other strings that are laterally offset from each other. In some embodiments, the strings may be arranged in a weave pattern. Another stack structure may vertically overlie the stack structure and the strings of memory cells and may include contact structures for providing electrical communication between conductive lines (e.g., access lines) and respective strings of the memory cells. The other stack structures may include pillars comprising a channel material vertically overlying each of the strings of memory cells of the stack structure. In some embodiments, the channel material of the pillars is substantially aligned with the channel material of the strings of memory cells. The contact structures may include a lateral dimension (e.g., area, cross-sectional area) that is greater than a lateral dimension of the pillars and may facilitate improved formation (e.g., alignment) of the contact structures to the strings of memory cells. The increased lateral dimension may facilitate formation of electrical connections to the contact structures and, in turn, to the associated strings of memory cells.

The microelectronic device may be formed by forming first pillars comprising a channel material extending through the stack structure and forming the other stack structure over the stack structure. The stack structure may comprise tiers comprising alternating insulative structures and other insulative structures. The other stack structure may include tiers of alternating insulative structures and sacrificial structures. The sacrificial structures may be formulated to be replaced by an electrically conductive material to form conductive structures. In some embodiments, the sacrificial structures comprise polysilicon. Second pillars comprising a channel material may be formed through the other stack structure and over and laterally aligned with the first pillars. The channel material of the second pillars may be in electrical communication with the channel material of the first pillars. In some embodiments, the channel material is substantially continuous through the first pillars and the second pillars. The second pillars may at least be partially filled with an insulative material. A sacrificial material may be formed over the insulative material and may fill a remaining portion of the second pillars. After forming the sacrificial material, at least a portion (e.g., an upper portion) of the sacrificial material may be removed and replaced with a conductive material. In some embodiments, the sacrificial material is directly converted to the conductive material. In other embodiments, the sacrificial material is removed, such as by etching, and the conductive material is formed over remaining portions of the sacrificial material. The conductive material may form a seed material on which additional conductive material may be grown to increase a dimension (e.g., a lateral dimension, such as a cross-sectional area) of the conductive material and form a self-aligned conductive contact having a larger dimension than the first pillars or the second pillars.

After forming the conductive contacts, portions of the other stack structure between the adjacent pillars may be removed to form select gate structure slots. In addition, portions of the other stack structure located between adjacent groups of second pillars may be removed to form additional slots. After forming the select gate structure slots and the additional slots, the sacrificial structures may be replaced (e.g., converted to, or removed and replaced) by a conductive material through the select gate structure slots and the additional slots to form conductive structures. For example, the sacrificial structures may be converted to an electrically conductive material. In other embodiments, the sacrificial structures are removed, such as by etching, and the electrically conductive material is formed at locations corresponding to the sacrificial structures to form conductive structures. After forming the conductive structures, the select gate structure slots and additional slots may be filled with a dielectric material. A replacement gate slot may be formed through the other stack structure and the stack structure. The other insulative structures of the stack structure may be removed, such as by wet etching. After removal of the other insulative structures, conductive structures may be formed at locations corresponding to the location of the other insulative structures to form strings of memory cells, each memory cell located at an intersection between a conductive structure and the channel material. The conductive contact structures may be electrically connected to electrically conductive lines (e.g., access lines, bit lines, digit lines) to electrically couple the strings of memory cells to electrically conductive lines.

The increased area of the conductive contacts may facilitate formation of electrical connections between the electrically conductive lines and the conductive contacts without having to relocate or shift the conductive contacts relative to the strings of memory cells. In addition, formation of the conductive contacts prior to replacement of the other insulative structures may facilitate improved alignment between the conductive contacts and the second pillars and associated strings of memory cells compared to conventional microelectronic devices wherein the conductive contacts are formed after replacing the other insulative structures with conductive structures. For example, replacement of the other insulative structures with conductive structures may undesirably cause bending of the microelectronic device (e.g., the stack structure) (also referred to as "block bending"), which increases a difficulty of forming conductive contacts to the strings of memory cells. However, forming the conductive contacts prior to replacement of the other insulative structures with conductive structures and forming the conductive contacts to have an increased dimension may facilitate improved alignment of the conductive contacts with the strings of memory cells.

Figure 1B:
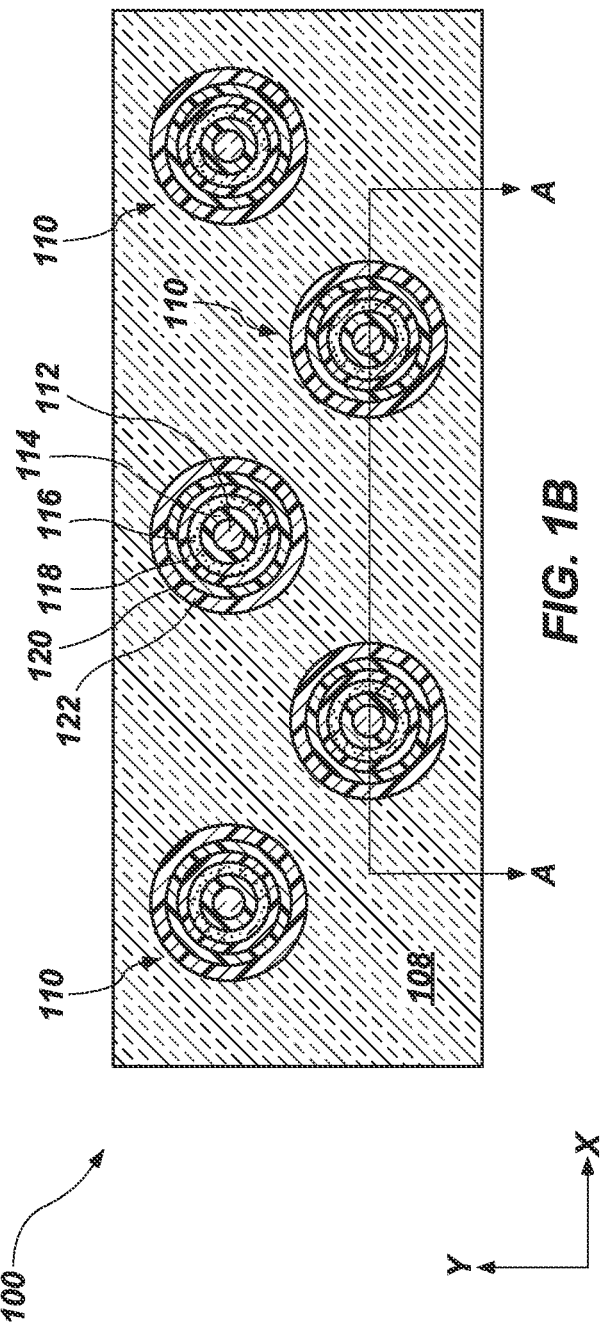
FIG. 1O and FIG. 1P are simplified cross-sectional views of a memory cells, in accordance with embodiments of the disclosure.
Figure 1C:
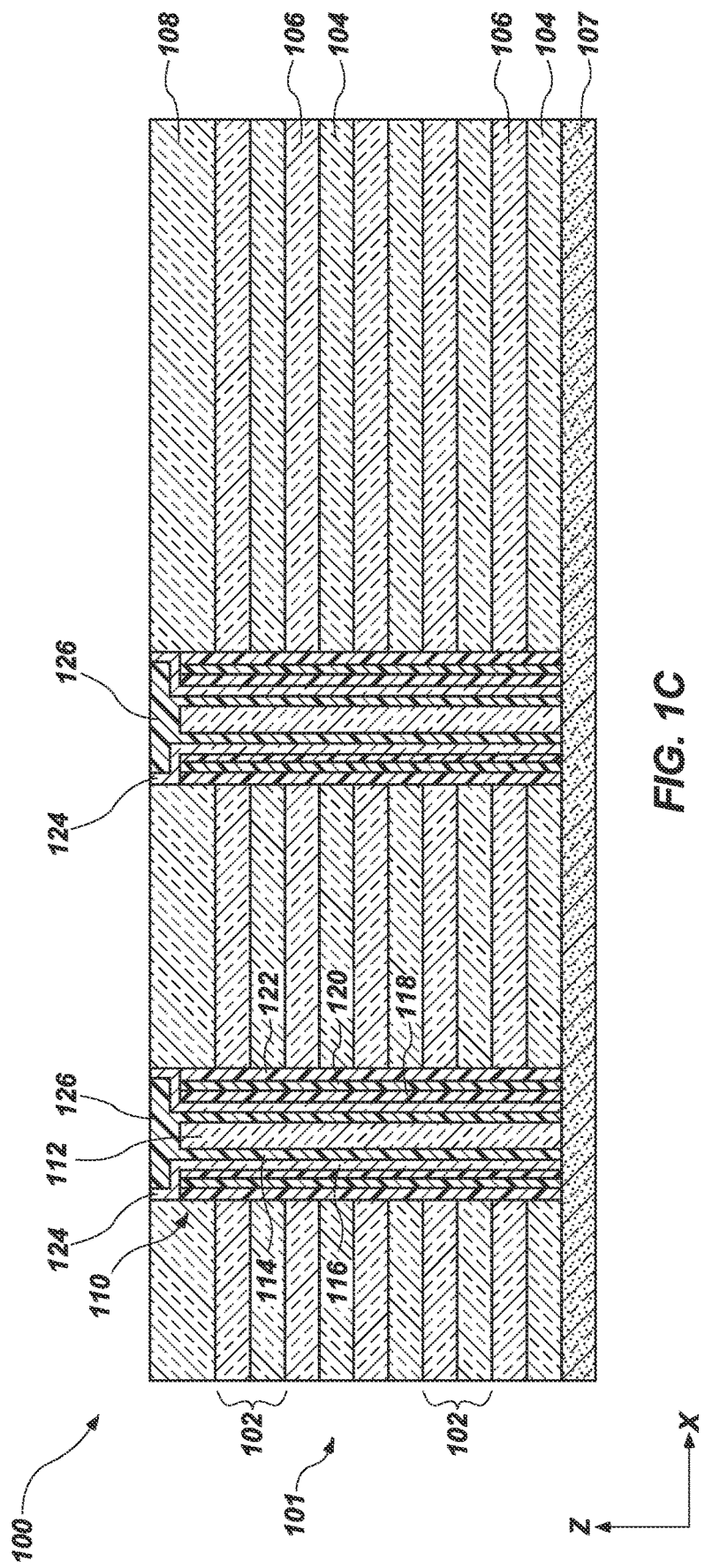
Figure 1D:
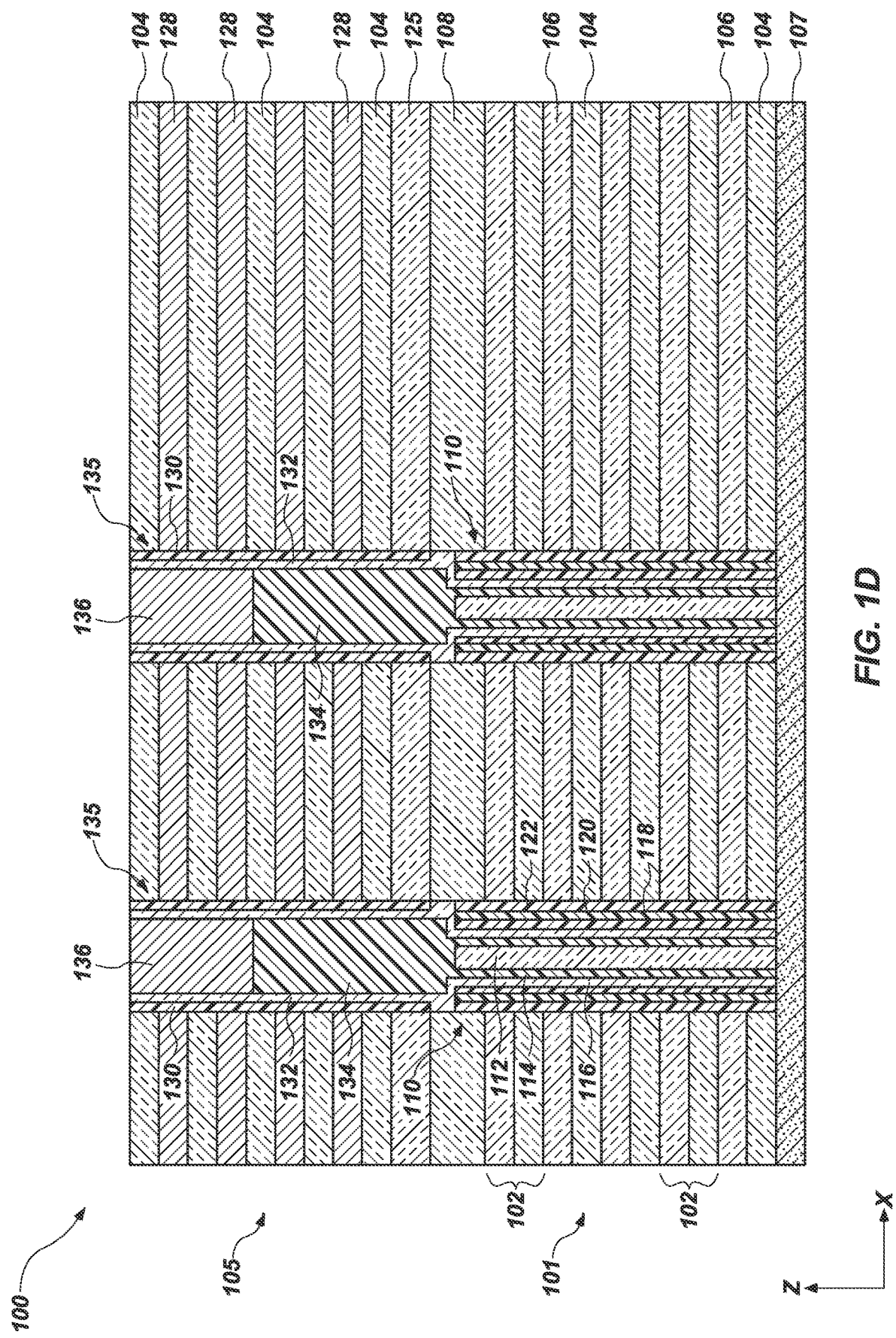
Figure 1E:
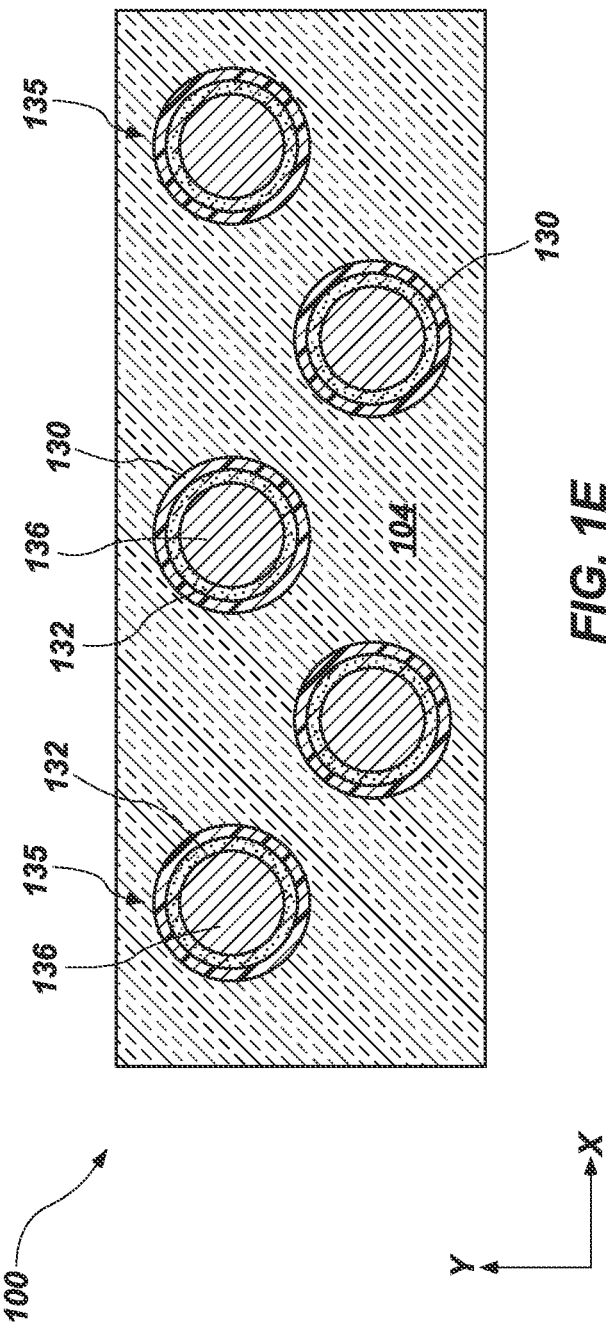
Figure 1F:
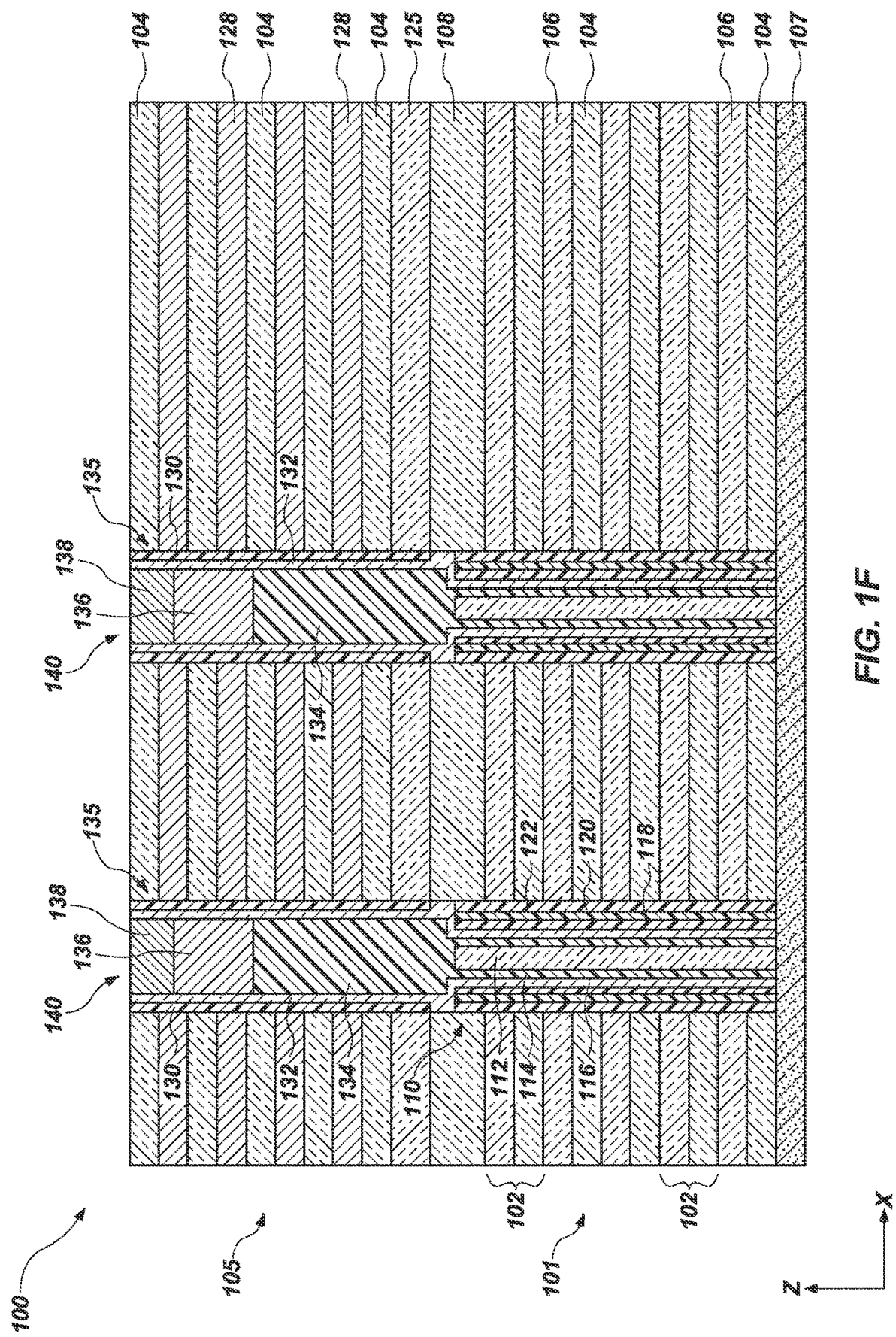
Figure 1G:
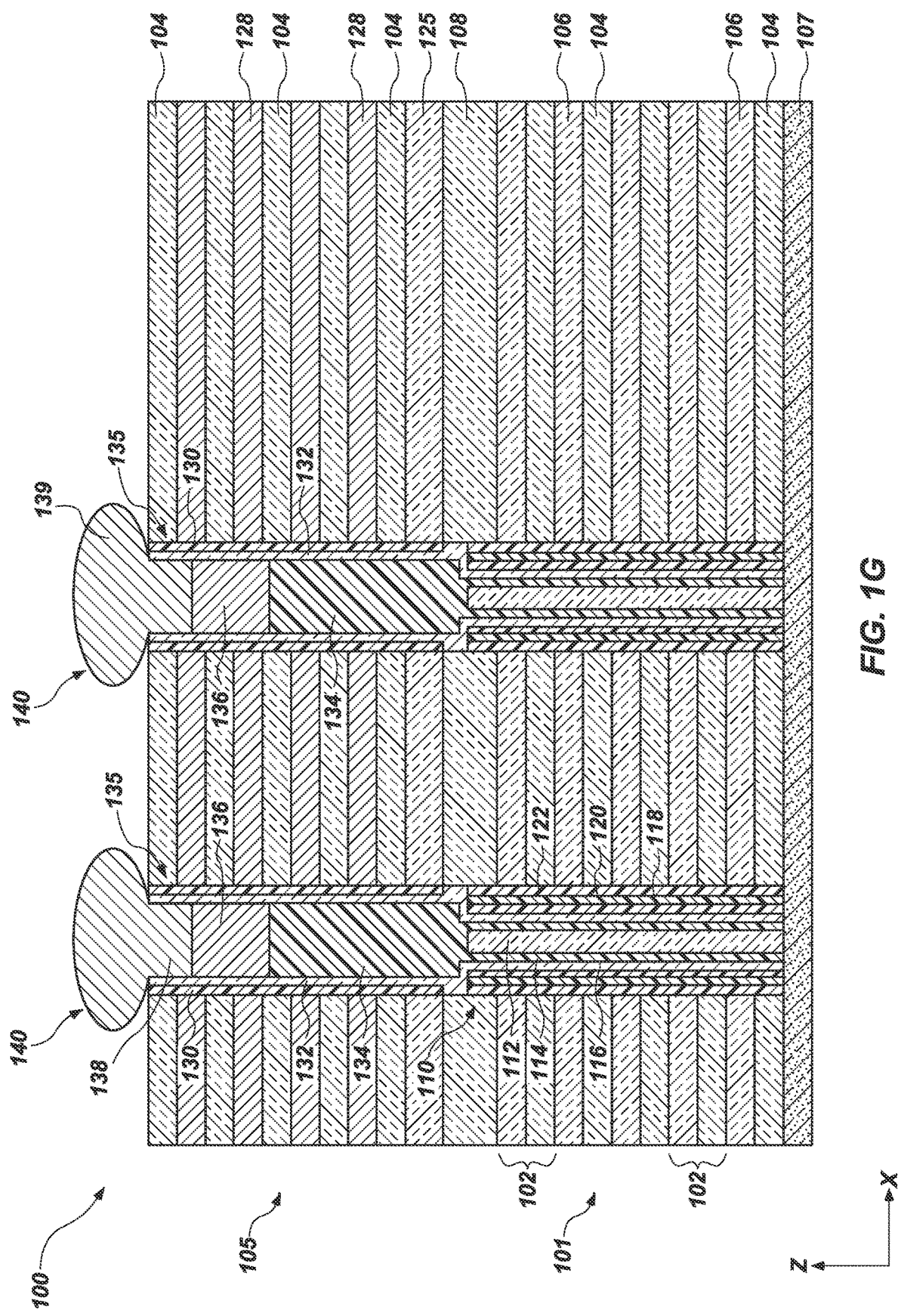
Figure 1H:
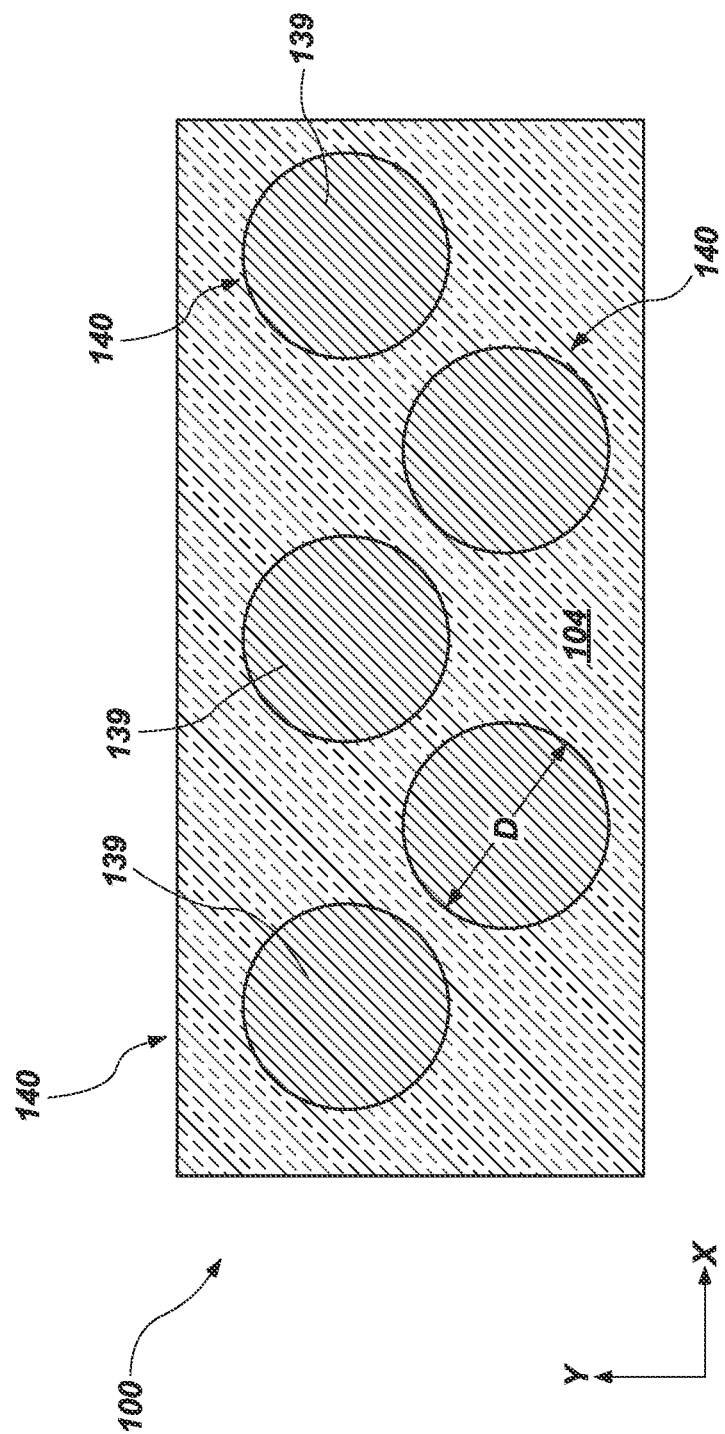
Figure 1I:
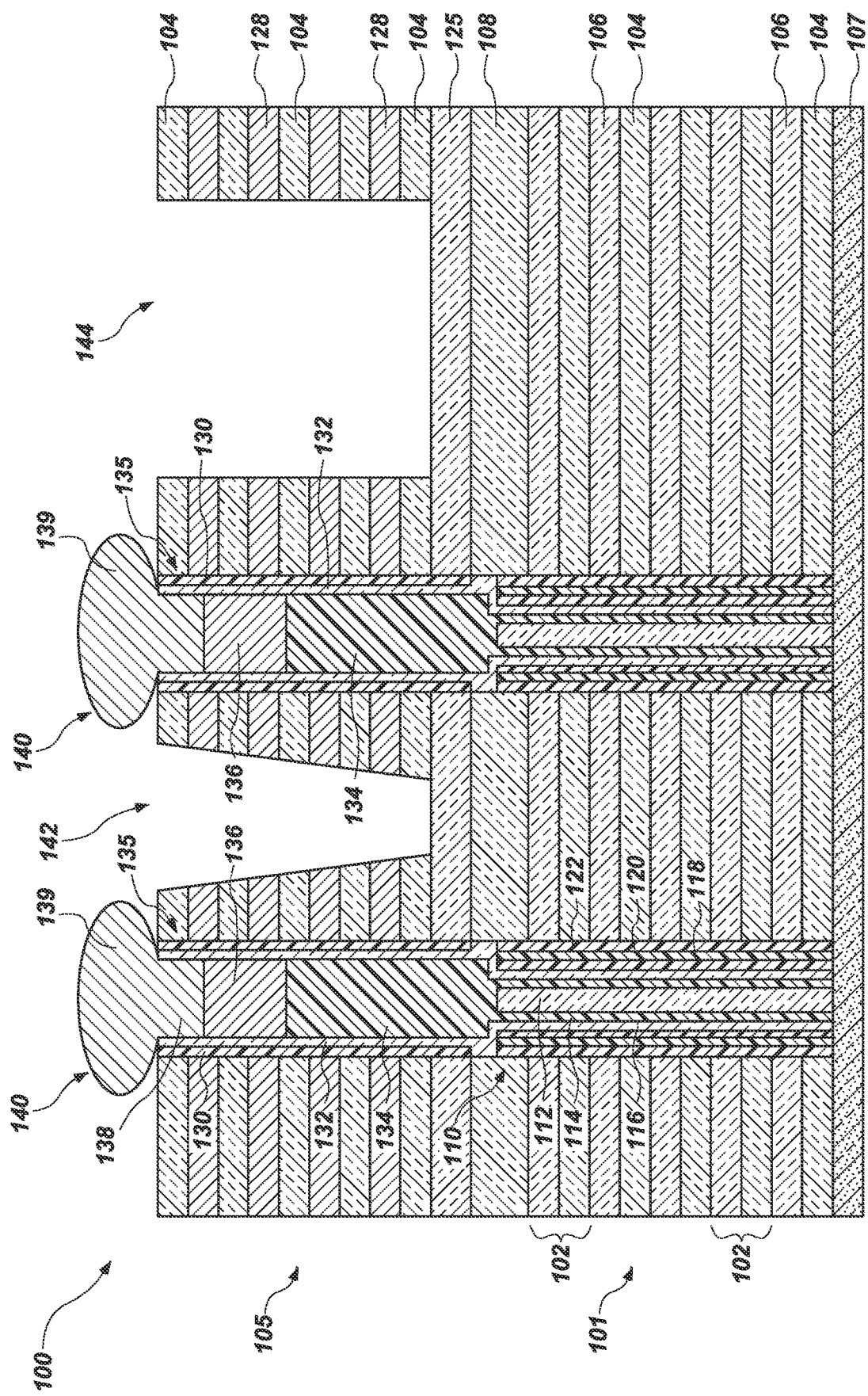
Figure 1J:
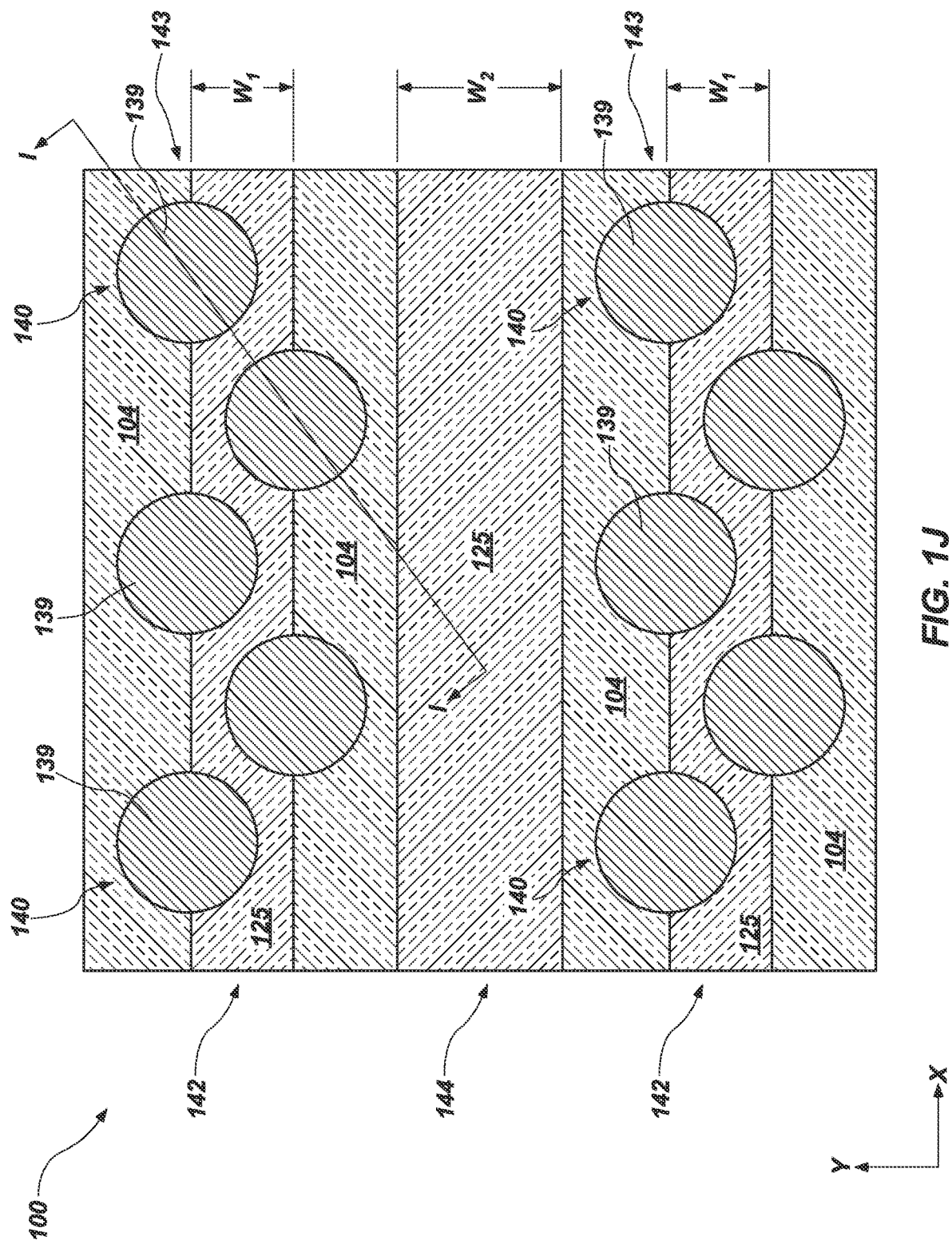
Figure 1K:
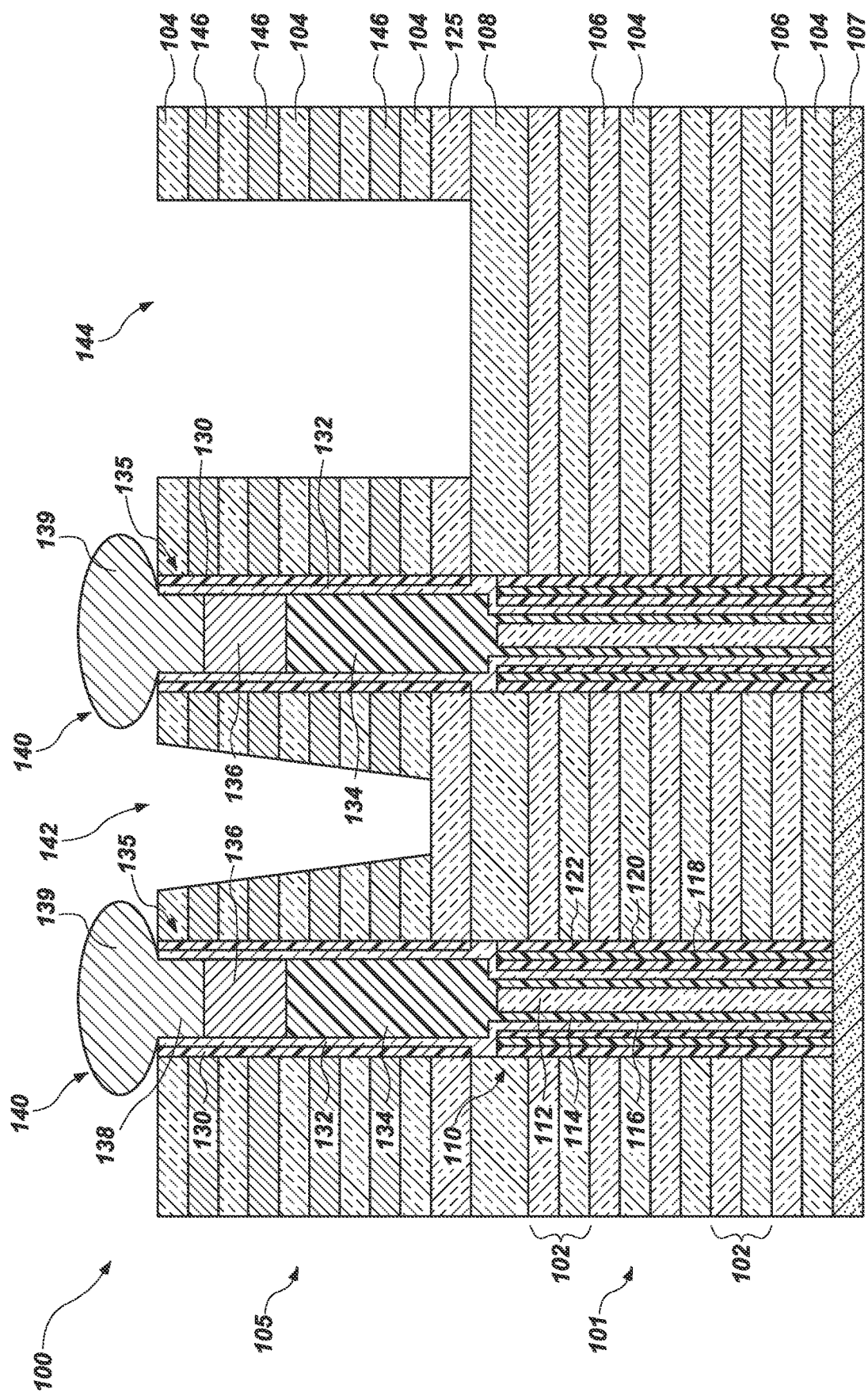
Figure 1L:
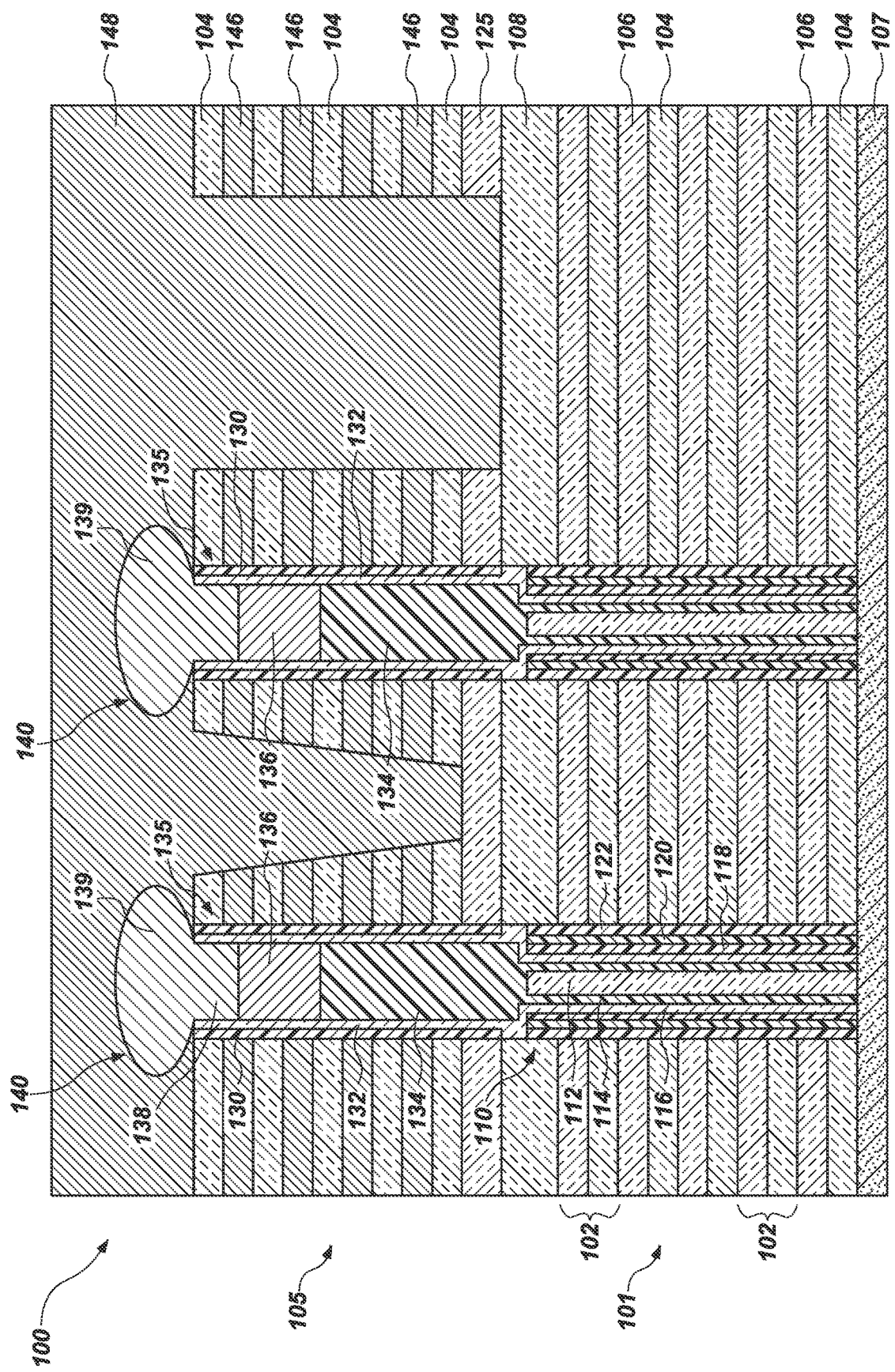
Figure 1M:
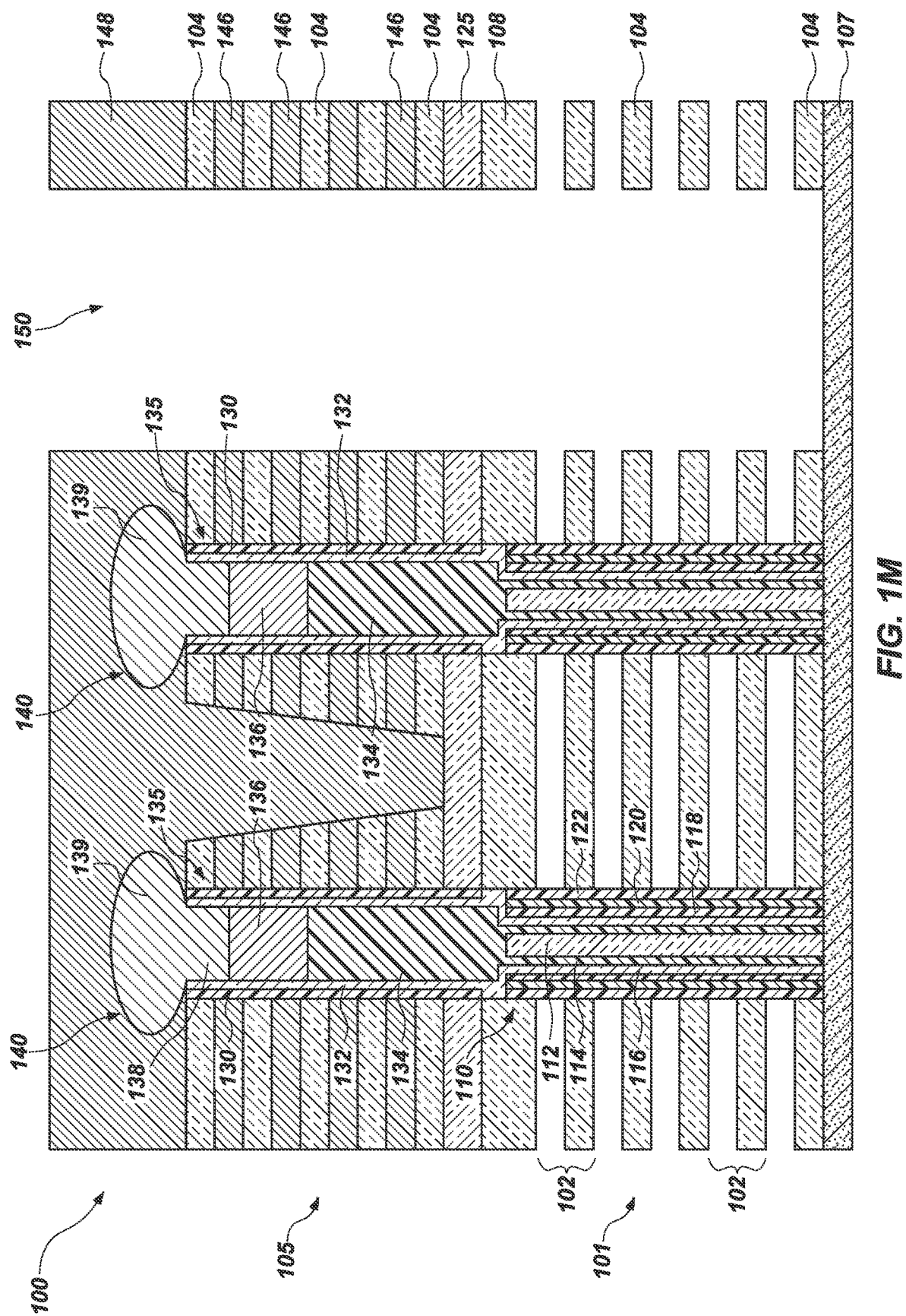
Figure 1N:
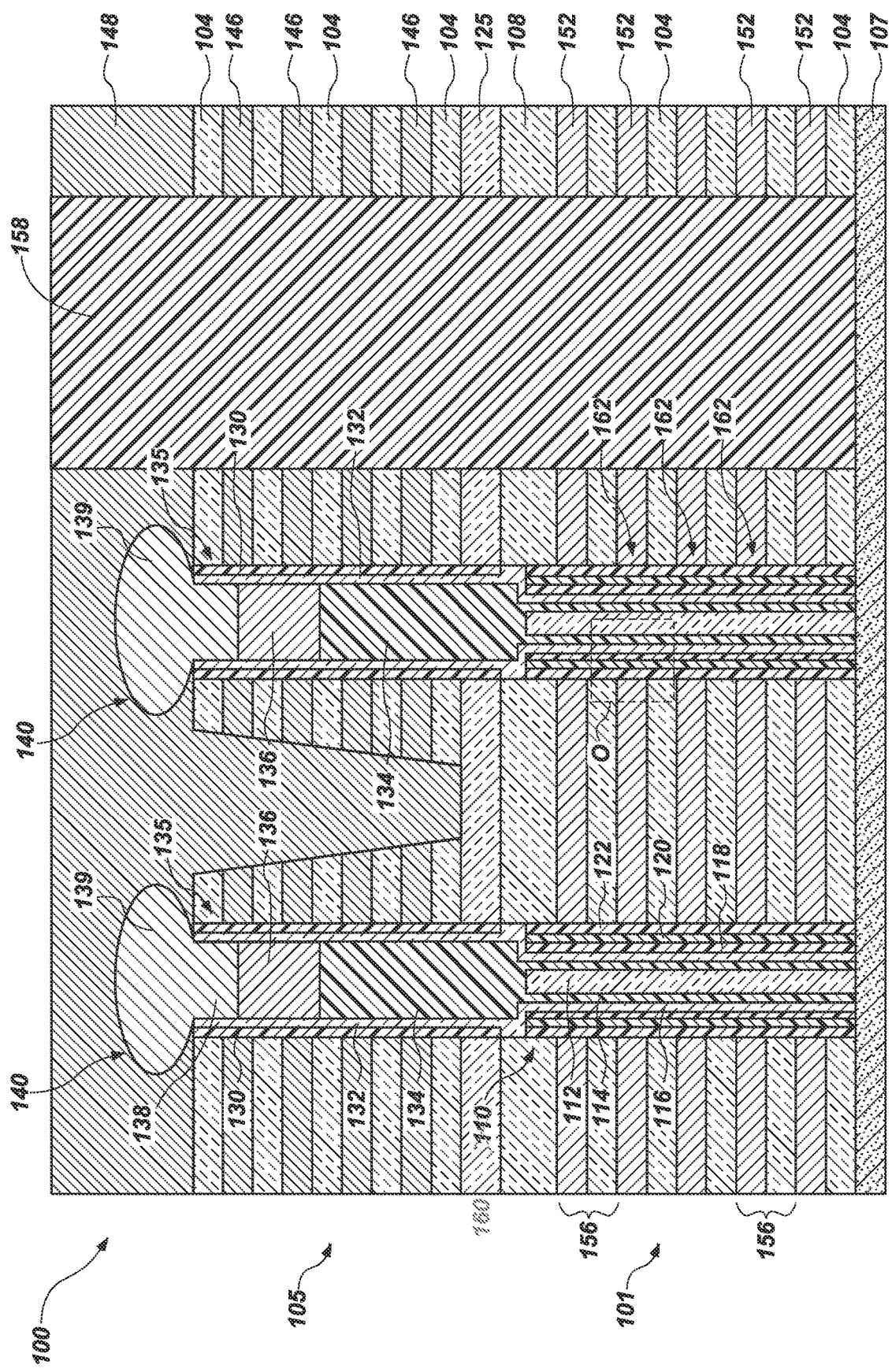

FIG. 1A through FIG. 1N illustrate a method of forming a microelectronic device structure, in accordance with embodiments of the disclosure. FIG. 1A is a simplified cross-sectional view of a microelectronic device structure 100, in accordance with embodiments of the disclosure. FIG. 1B is a top view of the microelectronic device structure 100 of FIG. 1A. The cross-section of FIG. 1A is taken through section line A-A of FIG. 1B. The microelectronic device structure 100 may include a stack structure 101 including a vertically (e.g., in the Z-direction) alternating sequence of insulative structures 104 and other insulative structures 106 arranged in tiers 102. Each of the tiers 102 may individually include a level of an insulative structure 104 directly vertically adjacent a level of the other insulative structures 106. The insulative structures 104 of the stack structure 101 may also be referred to herein as "insulative materials" and the other insulative structures 106 of the stack structure 101 may also be referred to herein as "other insulative materials."

In some embodiments, a number (e.g., quantity) of tiers 102 of the stack structure 101 may be within a range from 32 to 256 of the tiers 102. In some embodiments, the stack structure 101 includes 128 of the tiers 102. However, the disclosure is not so limited, and the stack structure 101 may include a different number of the tiers 102. In addition, in some embodiments, the stack structure 101 comprises a first deck structure vertically overlying a source structure 107 and comprising tiers 102 of the insulative structures 104 and the other insulative structures 106, and a second deck structure over the first deck structure, the second deck structure comprising tiers 102 of the insulative structures 104 and the other insulative structures 106. For example, the stack structure 101 may comprise a dual deck 3D NAND device (e.g., a 3D NAND Flash memory device).

The levels of the insulative structures 104 may be formed of and include, at least one dielectric material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), and aluminum oxide ($Al_2O_3$)). In some embodiments, the insulative structures 104 are formed of and include silicon dioxide.

The levels of the other insulative structures 106 may be formed of and include an insulative material that is different than, and exhibits an etch selectivity with respect to, the insulative structures 104. In some embodiments, the other insulative structures 106 are formed of and include a nitride material (e.g., silicon nitride ($Si_3N_4$)) or an oxynitride material (e.g., silicon oxynitride). In some embodiments, the other insulative structures 106 comprise silicon nitride.

The stack structure 101 may be formed over the source structure 107 (e.g., a source plate). The source structure 107 may be formed of and include, for example, a semiconductor material doped with one of P-type conductivity materials (e.g., polysilicon doped with at least one P-type dopant (e.g., boron ions)) or N-type conductivity materials (e.g., polysilicon doped with at least one N-type dopant (e.g., arsenic ions, phosphorous ions, antimony ions)). Although FIG. 1A has been described and illustrated as including the stack structure 101 directly over (e.g., on) the source structure 107, the disclosure is not so limited. In other embodiments, the stack structure 101 overlies a deck structure comprising additional tiers 102 of insulative structures 104 and other insulative structures 106 separated from the stack structure 101 by at least one dielectric material.

A dielectric material 108 may be located over an uppermost one of the tiers 102. The dielectric material 108 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the dielectric material 108 comprises the same material composition as the insulative structures 104. In some embodiments, the dielectric material 108 comprises silicon dioxide.

Pillars 110 of materials may vertically extend (e.g., in the Z-direction) through the stack structure 101. As will be described herein, the materials of the pillars 110 may form memory cells (e.g., strings of NAND memory cells). The pillars 110 may each individually comprise an insulative material 112, a dielectric material 114 horizontally adjacent to the insulative material 112, a channel material 116 horizontally adjacent to the insulative material 112, a tunnel dielectric material (also referred to as a "tunneling dielectric material") 118 horizontally adjacent to the channel material 116, a memory material 120 horizontally adjacent to the tunnel dielectric material 118, and a dielectric blocking material (also referred to as a "charge blocking material") 122 horizontally adjacent to the memory material 120. The dielectric blocking material 122 may be horizontally adjacent to one of the levels of other insulative structures 106 of one of the tiers 102 of the stack structure 101. The dielectric material 114 may be horizontally interposed between the insulative material 112 and the channel material 116; the channel material 116 may be horizontally interposed between the dielectric material 114 and the tunnel dielectric material 118; the tunnel dielectric material 118 may be horizontally interposed between the channel material 116 and the memory material 120; the memory material 120 may be horizontally interposed between the tunnel dielectric material 118 and the dielectric blocking material 122; and the dielectric blocking material 122 may be horizontally interposed between the memory material 120 and a level of the other insulative structure 106.

The insulative material 112 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 112 comprises silicon dioxide.

The dielectric material 114 may be formed of and include one or more of the materials described above with reference to the insulative material 112. In some embodiments, the dielectric material 114 comprises the same material composition as the insulative material 112. In some embodiments, the dielectric material 114 comprises silicon dioxide.

The channel material 116 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 116 includes amorphous silicon or polysilicon. In some embodiments, the channel material 116 comprises a doped semiconductor material.

The tunnel dielectric material 118 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 118 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 118 comprises silicon dioxide. In other embodiments, the tunnel dielectric material 118 comprises silicon oxynitride.

The memory material 120 may comprise a charge trapping material or a conductive material. The memory material 120 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 120 comprises silicon nitride.

The dielectric blocking material 122 may be formed of and include a dielectric material such as, for example, one or more of an oxide (e.g., silicon dioxide), a nitride (silicon nitride), and an oxynitride (silicon oxynitride), or another material. In some embodiments, the dielectric blocking material 122 comprises silicon oxynitride.

In some embodiments the tunnel dielectric material 118, the memory material 120, and the dielectric blocking material 122 together may comprise a structure configured to trap a charge, such as, for example, an oxide-nitride-oxide (ONO) structure. In some such embodiments, the tunnel dielectric material 118 comprises silicon dioxide, the memory material 120 comprises silicon nitride, and the dielectric blocking material 122 comprises silicon dioxide.

Referring to FIG. 1B, the pillars 110 may include some pillars 110 that are aligned with each other (e.g., in the Y-direction) and pillars 110 that are offset from each other (e.g., in the Y-direction). Accordingly, the pillars 110 may be arranged in a so-called weave pattern (e.g., a hexagonal close-packed arrangement), which may facilitate an increased density of the pillars 110 (and the resulting strings of memory cells) in the stack structure 101.

With reference to FIG. 1C, after forming the pillars 110, a portion of the pillars 110 may be removed to recess the pillars 110 relative to an uppermost surface of the dielectric material 108. In some embodiments, a channel material 124 may be formed within the recesses and in electrical communication with the channel material 116. The channel material 124 may include one or more of the materials described above with reference to the channel material 116. In some embodiments, the channel material 124 comprises the same material composition as the channel material 116. Since the channel material 124 may comprise the same material composition as the channel material 116, as used herein, the channel material 116 may refer to both the channel material 116 described with reference to FIG. 1A and the channel material 124.

With continued reference to FIG. 1C, after forming the channel material 124, another dielectric material 126 may be formed within remaining portions of the recesses over the insulative material 112 and over and adjacent to the channel material 124. The other dielectric material 126 may comprise one or more of the materials described above with reference to the dielectric material 114. In some embodiments, the other dielectric material 126 comprises silicon dioxide. Since the other dielectric material 126 may comprise the same material composition as the dielectric material 114, as used herein, the dielectric material 114 may be used to refer to both the dielectric material 114 and the other dielectric material 126.

Referring to FIG. 1D, after forming the additional channel material 124 (FIG. 1C) and the other dielectric material 126 (FIG. 1C), another stack structure 105 may be formed over the stack structure 101. The other stack structure 105 may include alternating levels of the insulative structures 104 and sacrificial structures 128 formed over an etch stop material 125. FIG. 1E is a simplified top view of the microelectronic device structure 100 of FIG. 1D.

The etch stop material 125 may be formed of and include, for example, a material exhibiting an etch selectivity with respect to the insulative structures 104 and the sacrificial structures 128. In some embodiments, the etch stop material 125 comprises a carbon-containing material (e.g., silicon carbon nitride (SiCN)).

The sacrificial structures 128 may be formed of and include a sacrificial material having different etch selectivity than the insulative structures 104. The sacrificial material of the sacrificial structures 128 may, for example, be selectively etchable relative to electrically insulative material of the insulative structures during mutual exposure to an etchant. As a non-limiting example, the sacrificial structures 128 may be formed of and include silicon, doped silicon, polysilicon, doped polysilicon, or silicon nitride. In embodiments where the sacrificial structures 128 are doped, the dopant may include one or more of at least one N-type dopant (such as one or more of phosphorus (P), arsenic (Ar), antimony (Sb), and bismuth (Bi)), at least one P-type dopant (such as one or more of boron (B), aluminum (Al), and gallium (Ga)), carbon (C), fluorine (F), chlorine (Cl), bromine (Br), hydrogen (H), deuterium ($^2$H), helium (He), neon (Ne), and argon (Ar). In some embodiments, the sacrificial structures 128 comprise polysilicon.

After forming the other stack structure 105, openings may be formed through the other stack structure 105 to expose portions of the pillars 110 of the stack structure 101. After forming the openings, a liner material 130 may be formed over surfaces (e.g., sidewalls) of the openings. In some embodiments, after forming the liner material 130, laterally extending portions of the liner material 130 may be removed, such as by dry etching (e.g., reactive ion etching (RIE)).

The liner material 130 may be formed of and include, for example, an insulative material, such as one or more of the materials described above with reference to dielectric material 114. In some embodiments, the liner material 130 comprises silicon dioxide.

After forming the liner material 130, a channel material 132 may be formed over sides of the liner material 130 and in contact with the channel material 116. The channel material 132 may comprise one or more of the same materials described above with reference to the channel material 116. In some embodiments, the channel material 132 comprises the same material composition as the channel material 116. In some embodiments, the channel material 132 may be continuous with the channel material 116. In some such embodiments, the channel material 132 in the stack structure 105 may be substantially laterally aligned (e.g., in the X-direction, in the Y-direction, or both) with the channel material 116 within the pillars 110 of the stack structure 101. Since the channel material 132 may comprise the same material composition as the channel material 116, as used herein, the channel material 116 refers to the channel material 116 and the channel material 132.

After forming the channel material 132, portions of the openings may be filled with an insulative material 134. The insulative material 134 may be formed of and include one or more of the materials described above with reference to the dielectric material 114. In some embodiments, the insulative material 134 comprises the same material composition as the dielectric material 114. In some embodiments, the insulative material 134 comprises silicon dioxide.

With continued reference to FIG. 1D, a sacrificial material 136 may be formed over the insulative material 134. The sacrificial material 136 may comprise one or more of the materials described above with reference to the sacrificial structures 128. In some embodiments, the sacrificial material 136 comprises the same material composition as the sacrificial structures 128. In some embodiments, the sacrificial material 136 comprises polysilicon.

The liner material 130, the channel material 132, the insulative material 134, and the sacrificial material 136 within the other stack structure 105 may comprise pillars 135. The pillars 135 may be substantially laterally aligned (e.g., in the X-direction and in the Y-direction) with the pillars 110 of the stack structure 101.

The microelectronic device structure 100 may be exposed to a chemical mechanical planarization (CMP) process to remove portions of the liner material 130, the channel material 132, the insulative material 134, and the sacrificial material 136 from surfaces of an uppermost of the insulative structures 104.

Referring to FIG. 1F, a portion of the sacrificial material 136 may be replaced with an electrically conductive material 138 to form contact structures (also referred to herein as "electrically conductive contact structures" or "conductive contact structures") 140 comprising the electrically conductive material 138. In some embodiments, a portion of the sacrificial material 136 may be removed such as by, for example, exposing the portion of the sacrificial material 136 to one or more etchants (e.g., dry etchants) to selectively remove the sacrificial material 136 and recess the sacrificial material 136 relative to the uppermost insulative structure 104.

In other embodiments, a portion of the sacrificial material 136 is converted to the electrically conductive material 138. By way of non-limiting example, the sacrificial material 136 may be treated with one or more chemical species facilitating the conversion of the sacrificial material 136 (e.g., silicon material, polysilicon material) thereof into tungsten (e.g., β-phase tungsten, α-phase tungsten). By way of non-limiting example, if the sacrificial material 136 comprises a doped silicon material, such as doped polycrystalline silicon, the sacrificial material 136 may be treated with tungsten hexafluoride ($WF_6$) to form the electrically conductive material 138. In some such embodiments, silicon (Si) of the sacrificial material 136 may react with the $WF_6$ to produce tungsten (W) and silicon tetrafluoride ($SiF_4$). The produced $SiF_4$ is removed as a gas. The produced W remains with any dopant(s) of the sacrificial material 136 to form the electrically conductive material 138. The sacrificial material 136 may, for example, be treated with $WF_6$ using a conventional CVD apparatus at a temperature within a range of from about 200° C. to about 500° C.

In some embodiments, the electrically conductive material 138 comprises tungsten. In some embodiments, the electrically conductive material 138 comprises—phase tungsten. β-phase tungsten has a metastable, A15 cubic structure. Grains of the β-phase tungsten may exhibit generally columnar shapes. Tungsten included within the electrically conductive material 138 may only be present in the β-phase, or may be present in the β-phase and in the alpha (α) phase. If present, the α-phase tungsten has a metastable, body-centered cubic structure. Grains of the α-phase tungsten may exhibit generally isometric shapes. If the electrically conductive material 138 includes β-phase tungsten and α-phase tungsten, an amount of β-phase tungsten included in the electrically conductive material 138 may be different than an amount of α-phase tungsten included in the electrically conductive material 138, or may be substantially the same as amount of α-phase tungsten included in the electrically conductive material 138. In some embodiments, an amount of β-phase tungsten included in the electrically conductive material 138 is greater than an amount of α-phase tungsten included in the electrically conductive material 138. For example, at least a majority (e.g., greater than 50 percent, such as greater than or equal to about 60 percent, greater than or equal to about 70 percent, greater than or equal to about 80 percent, greater than or equal to about 90 percent, greater than or equal to about 95 percent, or greater than or equal to about 99 percent) of the tungsten included in the electrically conductive material 138 may be present in the β-phase. In embodiments where the sacrificial material 136 comprises one or more dopants, the electrically conductive material 138 may include tungsten and the one or more dopants.

With reference to FIG. 1G and FIG. 1H, the electrically conductive material 138 within the pillars 135 may be used as a seed material to form additional electrically conductive material 139 and increase a size of the contact structures 140. In some embodiments, the additional electrically conductive material 139 is grown asymmetrically. In some such embodiments, a lateral dimension (e.g., in the X-direction, in the Y-direction, or both) of the additional electrically conductive material 139 may be grown faster than a vertical dimension (e.g., in the Z-direction). Growing the additional electrically conductive material 139 may form the electrically conductive material to have a larger lateral dimension (in the X-direction, the Y-direction, or both) than the pillars 135. Accordingly, a contact area of the contact structures 140 may be increased relative to the dimensions of the pillars 135. In some embodiments, the additional electrically conductive material 139 extends vertically above the pillars 135. Stated another way, the additional electrically conductive material 139 (and the associated contact structures 140) extend vertically above an uppermost level of the insulative structures 104.

A dimension D (e.g., a diameter) of the contact structures may be within a range of from about 100 nm to about 150 nm, such as from about 100 nm to about 110 nm, from about 110 nm to about 120 nm, from about 120 nm to about 130 nm, or from about 130 nm to about 150 nm. In some embodiments, the dimension is about 100 nm. In other embodiments, the dimension is greater than about 100 nm, such as greater than about 120 nm. However, the disclosure is not so limited and the dimension D may be different than those described.

The additional electrically conductive material 139 may comprise the same material composition as the electrically conductive material 138. In some embodiments, the additional electrically conductive material 139 comprises tungsten.

In some embodiments, the electrically conductive material 138 is exposed to one or more of CVD, ALD, PVD, PECVD, and LPCVD to grow the additional electrically conductive material 139. The additional electrically conductive material 139 may be formed by one or more of chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD).

The additional electrically conductive material 139 may be grown by exposing the electrically conductive material 138 to one or more of tungsten hexafluoride ($WF_6$), disalane ($Si_2H_6$), tungsten hexacarbonyl ($W(CO_6)$), bis(tert-butylimino)bis(tert-butylamino)tungsten (($C_4H_9NH_2$)W ($C_4H_9N)_2$), bis(tert-butylimino)bis(dimethylamino)tungsten (VI) ((($CH_3)_3CN)_2W(N(CH_3)_2)_2$), bis(cyclopentadienyl) tungsten(IV) dihydride ($C_{10}H_{12}W$), or another tungsten precursor. In some embodiments, the additional electrically conductive material 139 is formed by sequential exposure of the electrically conductive material 138 to $WF_6$ and $Si_2H_6$.

Referring to FIG. 1I, after growing the additional electrically conductive material 139, select gate structure slots (e.g., slits) 142 and additional slots (e.g., slits) 144 may be formed through the other stack structure 105. FIG. 1J is a top view of the microelectronic device structure 100 of FIG. 1I. The cross-section of FIG. 1I is taken through section line I-I of FIG. 1J.

With reference to FIG. 1I and FIG. 1J, the select gate structure slots 142 and additional slot 144 may be formed through the other stack structure 105 and expose a portion of the etch stop material 125. The select gate structure slots 142 and the additional slot 144 may be formed by, for example, exposing the microelectronic device structure 100 to one or more etchants to selectively remove the insulative structures 104 and the sacrificial structures 128 without substantially removing the electrically conductive material 138 of the contact structures 140.

The select gate structure slots 142 may be formed between adjacent (e.g., in the X-direction and the Y-direction) contact structures 140. The select gate structure slots 142 may extend in the X-direction along a length of the microelectronic device structure 100. With reference to FIG. 1J, in some embodiments, about one half of each of the contact structures 140 may overlie the select gate structure slots 142 and about one half of each of the contact structures 140 may overlie other portions (e.g., the insulative structure 104) of the microelectronic device structure 100. Stated another way, about one half of each of the contact structures 140 may be laterally aligned (e.g., in the X-direction, in the Y-direction, or both) with the select gate structure slots 142 and the other about one half of each of the contact structures 140 may not be aligned with the select gate structure slots 142. In some such embodiments, forming the select gate structure slots 142 may include forming the select gate structure slots 142 in between the contact structures 140 and associated pillars 135 (FIG. 1I) and pillars 110 (FIG. 1I) in the X-direction and in the Y-direction.

A width $W_1$ of the select gate structure slots 142 may be within a range from about 30 nm to about 150 nm, such as from about 30 nm to about 50 nm, from about 50 nm to about 75 nm, from about 75 nm to about 100 nm, or from about 100 nm to about 150 nm. In some embodiments, the width $W_1$ is about 100 nm. In other embodiments, the width $W_1$ is greater than about 100 nm. However, the disclosure is not so limited and the width $W_1$ may be different than those described.

With continued reference to FIG. 1I and FIG. 1J, the additional slot 144 may be formed between (e.g., in the Y-direction) adjacent select gate structure slots 142 and between adjacent groups of pillars 135 (FIG. 1I). For example, the additional slot 144 may separate the microelectronic device structure 100 into blocks 143, each block 143 comprising a first group of the pillars 135 and contact structures 140.

A width $W_2$ of the additional slot 144 may be within a range from about 100 nm to about 400 nm, such as from about 100 nm to about 200 nm, from about 200 nm to about 300 nm, or from about 300 nm to about 400 nm. In some embodiments, the width $W_2$ of the additional slot 144 may be greater than the width $W_1$ of the select gate structure slot 142. In some embodiments, the width $W_2$ is from about 200 nm to about 300 nm. However, the disclosure is not so limited and the width $W_2$ of the additional slot 144 may be different than those described.

Referring to FIG. 1K, the sacrificial structures 128 (FIG. 1I) may be at least partially replaced with conductive structures 146 by way of the select gate structure slots 142 and the additional slot 144. The sacrificial structures 128 may be at least partially removed as described above with reference to removal of the sacrificial material 136. For example, the sacrificial structures 128 may be removed by exposing the sacrificial structures 128 to one or more etchants (e.g., dry etchants) to selectively remove the sacrificial material and recess the sacrificial structures 128 relative to the insulative structures 104.

In other embodiments, the sacrificial structures 128 are at least partially converted an electrically conductive material to form the conductive structures 146. By way of non-limiting example, the sacrificial structures 128 may be treated with one or more chemical species facilitating the conversion of the sacrificial structures 128 (e.g., silicon material, polysilicon material) thereof into tungsten (e.g., β-phase tungsten, α-phase tungsten), as described above with reference to conversation of the sacrificial material 136 to the electrically conductive material 138. By way of non-limiting example, if the sacrificial structures 128 comprise a doped silicon material, such as doped polycrystalline silicon, the sacrificial structures 128 may be treated with tungsten hexafluoride ($WF_6$) to form the conductive structures 146. In some such embodiments, silicon (Si) of the sacrificial structures 128 may react with the $WF_6$ to produce tungsten (W) and silicon tetrafluoride ($SiF_4$). The produced $SiF_4$ is removed as a gas. The produced W remains with any dopant(s) of the sacrificial structures 128 to form the conductive structures 146. The sacrificial structures 128 may, for example, be treated with $WF_6$ using a conventional CVD apparatus at a temperature within a range of from about 200° C. to about 500° C.

In some embodiments, the conductive structures 146 are formed in substantially the same manner as formation of the electrically conductive material 138 of the contact structures 140.

In some embodiments, the conductive structures 146 comprise tungsten. In some embodiments, the conductive structures 146 comprise the same material composition as the contact structures 140. In some embodiments, such as where the sacrificial structures 128 comprise polysilicon, forming the conductive structures 146 may comprise converting the polysilicon of the sacrificial structures 128 to the conductive structures 146 comprising tungsten.

The conductive structures 146 may comprise so-called select gate structures (e.g., select drain structures (SDS)). As will be described herein, the conductive structures 146 may be used for selecting memory cells of a particular string of memory cells. Although FIG. 1K illustrates four conductive structures 146, the disclosure is not so limited. The microelectronic device structure 100 may include any number of conductive structures 146, such as fewer than four conductive structures 146 (e.g., one conductive structure 146, two conductive structures 146, three conductive structures 146) or greater than four conductive structures 146 (e.g., five conductive structures 146, six conductive structures 146, seven conductive structures 146, eight or more conductive structures 146).

Referring to FIG. 1L, after forming the conductive structures 146 through the select gate structure slots 142 and the additional slot 144, the select gate structure slots 142 and the additional slot 144 may be filled with a dielectric material 148. In some embodiments, the dielectric material 148 is formed over the uppermost insulative structure 104. The dielectric material 148 may overlie and substantially surround the contact structures 140. In some embodiments, the dielectric material 148 extends into and through the other stack structure 105. For example, the dielectric material 148 may be located between adjacent conductive contact structures 140 (at locations corresponding to the location of the select gate structure slots 142 (FIG. 1I, FIG. 1J)).

The dielectric material 148 may be formed of and include and electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the dielectric material 148 comprises silicon dioxide.

Referring to FIG. 1M, after forming the dielectric material 148, a replacement gate slot 150 may be formed at a location corresponding to the additional slot 144. The replacement gate slot 150 may extend through the other stack structure 105 and the stack structure 101. In some embodiments, the replacement gate slot 150 exposes a portion of the source structure 107.

After forming the replacement gate slot 150, the other insulative structures 106 of the stack structure 101 may be removed through the replacement gate slot 150 as part of a so-called "replacement gate" or "gate last" process. By way of non-limiting example, the other insulative structures 106 may be removed by exposing the other insulative structures 106 to a wet etchant comprising one or more of phosphoric acid, sulfuric acid, hydrochloric acid, nitric acid, or another material. In some embodiments, the other insulative structures 106 are removed by exposing the other insulative structures 106 to a so-called "wet nitride strip" comprising a wet etchant comprising phosphoric acid.

Referring to FIG. 1N, after removal of the other insulative structures 106 (FIG. 1L), conductive structures 152 may be formed between the adjacent insulative structures 104 at locations corresponding to the locations of the other insulative structures 106 to form a microelectronic device 100 comprising a stack structure 101 comprising tiers 156 of alternating levels of the insulative structures 104 and the conductive structures 152.

The conductive structures 152 may be formed of and include an electrically conducive material, such as at least one electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive structures 152 comprise tungsten. In some embodiments, the conductive structures 152 comprise a different material composition than the contact structures 140 and the conductive structures 146.

In some embodiments, the conductive structures 152 may include a conductive liner material around the conductive structures 152, such as between the conductive structures 152 and the insulative structures 104. The conductive liner material may comprise, for example, a seed material from which the conductive structures 152 may be formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride.

After forming the conductive structures 152, the replacement gate slot 150 may be filled with a dielectric material 158. The dielectric material 158 may extend through the other stack structure 105 and the stack structure 101. In addition, the dielectric material 158 may be located between adjacent blocks 143 (FIG. 1J).

The dielectric material 158 may be formed of and include one or more of the materials described above with reference to the dielectric material 148. For example, the dielectric material 158 may be formed of and include one or more of phosphosilicate glass (PSG), borosilicate glass (BSG), fluorosilicate glass (FSG), borophosphosilicate glass (BPSG), and silicon dioxide. In some embodiments, the dielectric material 158 comprises the same material composition as the dielectric material 148. In some embodiments, the dielectric material 158 comprises silicon dioxide.

Formation of the conductive structures 152 may form strings 160 of memory cells 162, the memory cells 162 located at an intersection of the channel material 116 and the conductive structures 152. Vertically adjacent memory cells 162 of the strings 160 may be separated from each other by one of the levels of the insulative structures 104.

FIG. 1O is a simplified blown up view of box O of FIG. 1N and illustrates one of the memory cells 162 of FIG. 1A. With reference to FIG. 1O and FIG. 1A, each memory cell 162 may include the insulative material 112, the dielectric material 114 horizontally adjacent to the insulative material 112, the channel material 116 horizontally adjacent to the insulative material 112, the tunnel dielectric material 118 horizontally adjacent to the channel material 116, the memory material 120 horizontally adjacent to the tunnel dielectric material 118, and the dielectric blocking material 122 horizontally adjacent to the memory material 120. The dielectric blocking material 122 may be horizontally adjacent to one of the levels of the conductive structures 152. The channel material 116 may be horizontally interposed between the insulative material 112 and the tunnel dielectric material 118; the tunnel dielectric material 118 may be horizontally interposed between the channel material 116 and the memory material 120; the memory material 120 may be horizontally interposed between the tunnel dielectric material 118 and the dielectric blocking material 122; and the dielectric blocking material 122 may be horizontally interposed between the memory material 120 and the level of conductive structure 152. A conductive liner material 153 (not illustrated in FIG. 1N for clarity) may be located between the conductive structure 152 and the insulative structures 104. The conductive structure 152 may include one or more of a metal (e.g., titanium, tantalum), a metal nitride (e.g., tungsten nitride, titanium nitride, tantalum nitride), as described above.

After forming the dielectric material 158, the microelectronic device structure 100 may be completed by, for example, forming conductive lines (e.g., access lines, such as bit lines or digit lines) in electrical communication with the contact structures 140. In some embodiments, the conductive lines are formed directly over the contact structures 140. Since the contact structures 140 comprise the additional electrically conductive material 139 and exhibit an area larger than the area of the pillars 135, the contact structures 140 may facilitate formation of conductive lines in alignment with the contact structures 140 and the strings 160 of memory cells 162 directly above the pillars 135. Forming the contact structures 140 by growing the additional electrically conductive material 139 from the electrically conductive material 138 may form self-aligned contacts that are aligned with the memory strings 160. The contact structures 140 may be formed without a mask material and photolithography techniques to align the contact structures 140 with the pillars 135 or with the strings 160.

In addition, forming the contact structures 140 prior to formation of the replacement gate slot 150 (FIG. 1M) and prior to replacement of the insulative structures 104 (FIG. 1L) with the conductive structures 152 (FIG. 1N) may facilitate improved alignment between the contact structures 140 and the strings 160 of memory cells 162. By way of comparison, during conventional fabrication of microelectronic device structures, conductive structures (e.g., conductive structures 152) may be formed prior to forming contact structures (e.g., contact structures 140). However, formation of the conductive structures may induce stresses in the stack structure 101 and the other stack structure 105, leading to so-called "block bending." The block bending may cause upper portions of the stack structure to be laterally offset from lower portions of the stack structure, increasing a difficultly of contact alignment for forming contacts to strings of memory cells and access lines.

Although the memory cells 162 of FIG. 1N and FIG. 1O have been described and illustrated as comprising various materials, the disclosure is not so limited. FIG. 1P is a simplified blown up view of a memory cell 170, in accordance with embodiments of the disclosure. The memory cell 170 may replace one or more of the memory cells 162 of FIG. 1N. With reference to FIG. 1P, the memory cell 170 may include the insulative material 112 and the channel material 116 as described above with reference to the memory cells 162. The memory cell 170 may further include a first dielectric material (e.g., a tunnel dielectric material) 172 horizontally adjacent to the channel material 116, a second dielectric material (e.g., a charge trapping material) 174 horizontally adjacent to the first dielectric material 172, and a third dielectric material (e.g., a charge blocking material) 176 horizontally adjacent to the second dielectric material 174 and the conductive structure 152. In some embodiments, the first dielectric material 172 comprises an oxide material (e.g., silicon dioxide), the second dielectric material 174 comprises a nitride material (e.g., silicon nitride), and the third dielectric material 176 comprises an oxide material (e.g., silicon dioxide).

Although FIG. 1O and FIG. 1P have illustrated and described the memory cells 162, 170 as having a particular configuration, the disclosure is not so limited. In other embodiments, the memory cells 162, 170 may comprise suitable memory cells that may form a part of, for example, a NAND string.

Figure 2:
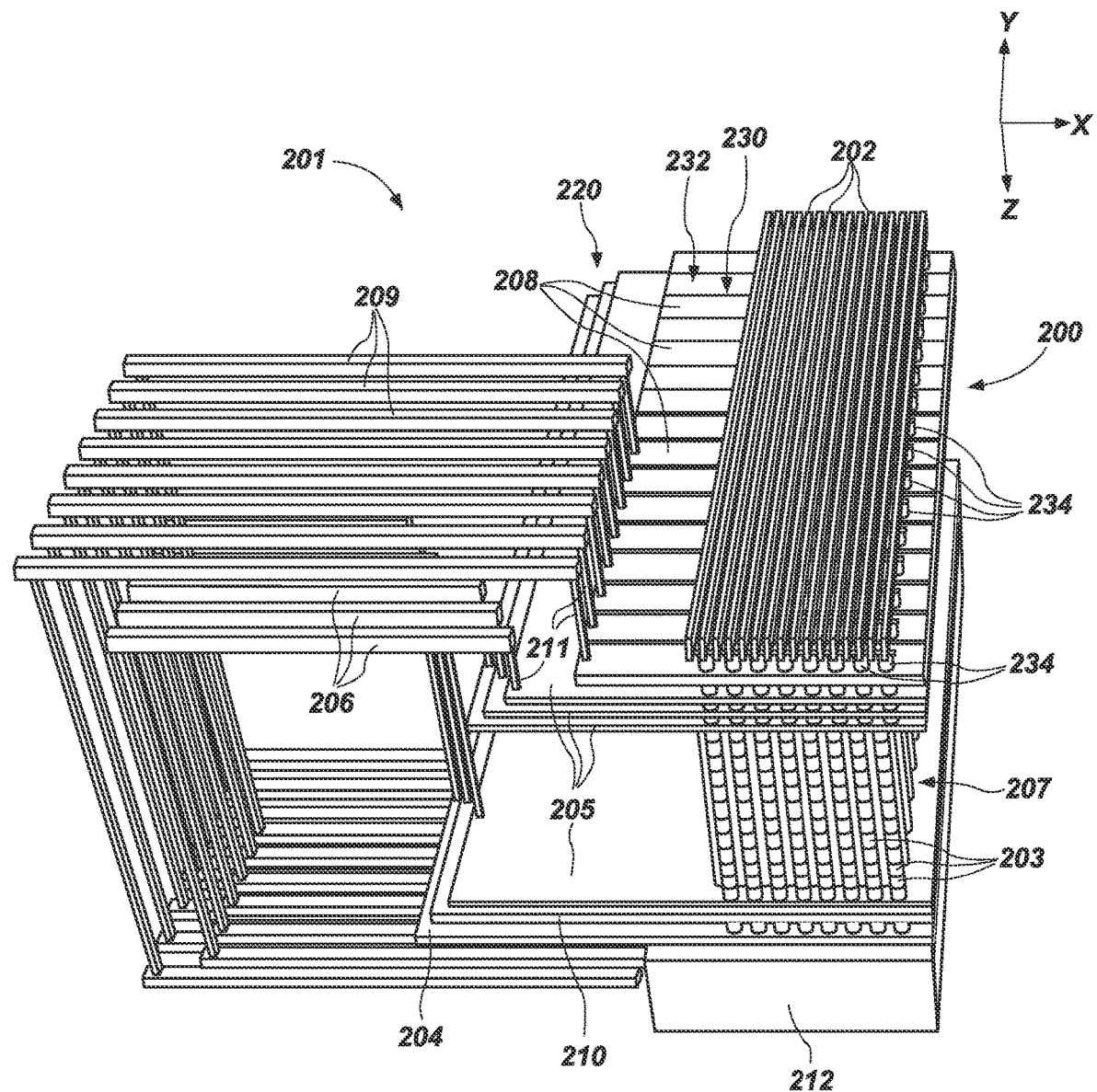
FIG. 2 is a partial cutaway perspective view of a microelectronic device, in accordance with embodiments of the disclosure.

FIG. 2 illustrates a partial cutaway perspective view of a portion of a microelectronic device 201 (e.g., a memory device, such as a dual deck 3D NAND Flash memory device) including a microelectronic device structure 200. The microelectronic device structure 200 may be substantially similar to the microelectronic device structure 100 previously described with reference to FIG. 1A through FIG. 1N. As shown in FIG. 2, the microelectronic device structure 200 may include a staircase structure 220 defining contact regions for connecting access lines 206 to conductive tiers 205 (e.g., conductive layers, conductive plates, such as the conductive structures 152 (FIG. 1N)). The microelectronic device structure 200 may include vertical strings 207 (e.g., strings 160 (FIG. 1N)) of memory cells 203 (e.g., memory cells 162 (FIG. 1N, FIG. 1O), memory cells 170 (FIG. 1P)) that are coupled to each other in series. The vertical strings 207 may extend vertically (e.g., in the Z-direction) and orthogonally to conductive lines and tiers 205, such as data lines 202, a source tier 204 (e.g., the source structure 107 (FIG. 1N)), the conductive tiers 205, the access lines 206, first select gates 208 (e.g., upper select gates, drain select gates (SGDs), such as the conductive structures 146 (FIG. 1N)), select lines 209, and a second select gate 210 (e.g., a lower select gate, a source select gate (SGS)). The select gates 208 may be horizontally divided (e.g., in the Y-direction) into multiple blocks 232 (e.g., blocks 143 (FIG. 1J)) horizontally separated (e.g., in the Y-direction) from one another by slots 230 (e.g., the dielectric material 158 formed within the replacement gate slot 150 (FIG. 1M)).

Vertical conductive contacts 211 may electrically couple components to each other as shown. For example, the select lines 209 may be electrically coupled to the first select gates 208 and the access lines 206 may be electrically coupled to the conductive tiers 205. The microelectronic device 201 may also include a control unit 212 positioned under the memory array, which may include at least one of string driver circuitry, pass gates, circuitry for selecting gates, circuitry for selecting conductive lines (e.g., the data lines 202, the access lines 206), circuitry for amplifying signals, and circuitry for sensing signals. The control unit 212 may be electrically coupled to the data lines 202, the source tier 204, the access lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., bit lines) may extend horizontally in a second direction (e.g., in the Y-direction) that is at an angle (e.g., perpendicular) to the first direction in which the first select gates 208 extend. The data lines 202 may be coupled to respective second groups of the vertical strings 207 at the first end (e.g., the upper end) of the vertical strings 207. A first group of vertical strings 207 coupled to a respective first select gate 208 may share a particular vertical string 207 with a second group of vertical strings 207 coupled to a respective data line 202. Thus, a particular vertical string 207 may be selected at an intersection of a particular first select gate 208 and a particular data line 202. Accordingly, the first select gates 208 may be used for selecting memory cells 203 of the strings 207 of memory cells 203.

The conductive tiers 205 (e.g., word line plates) may extend in respective horizontal planes. The conductive tiers 205 may be stacked vertically, such that each conductive tier 205 is coupled to all of the vertical strings 207 of memory cells 203, and the vertical strings 207 of the memory cells 203 extend vertically through the stack of conductive tiers 205. The conductive tiers 205 may be coupled to or may form control gates of the memory cells 203 to which the conductive tiers 205 are coupled. Each conductive tier 205 may be coupled to one memory cell 203 of a particular vertical string 207 of memory cells 203.

The first select gates 208 and the second select gates 210 may operate to select a particular vertical string 207 of the memory cells 203 between a particular data line 202 and the source tier 204. Thus, a particular memory cell 203 may be selected and electrically coupled to a data line 202 by operation of (e.g., by selecting) the appropriate first select gate 208, second select gate 210, and conductive tier 205 that are coupled to the particular memory cell 203.

The staircase structure 220 may be configured to provide electrical connection between the access lines 206 and the tiers 205 through the vertical conductive contacts 211. In other words, a particular level of the tiers 205 may be selected via an access line 206 in electrical communication with a respective conductive contact 211 in electrical communication with the particular tier 205.

The data lines 202 may be electrically coupled to the vertical strings 207 through conductive contact structure 234 (e.g., the contact structures 140 (FIG. 1N)). As described above with reference to FIG. 1N, the conductive contact structures 234 may exhibit a relatively large area for forming aligned contacts between the data lines 202 and the vertical strings 207 of memory cells 203.

Accordingly, in some embodiments, a microelectronic device comprises a stack structure comprising alternating conductive structures and insulative structures arranged in tiers, each of the tiers individually comprising a conductive structure and an insulative structure, strings of memory cells vertically extending through the stack structure, the strings of memory cells comprising a channel material vertically extending through the stack structure, an other stack structure vertically overlying the stack structure and comprising alternating levels of other conductive structures and other insulative structures, the other stack structure comprising pillars vertically overlying the strings of memory cells, each pillar comprising an other channel material in electrical communication with the channel material of the strings of memory cells, and conductive contact structures vertically overlying the other stack structure, each conductive contact structure comprising an electrically conductive contact at least partially extending into the pillars and a portion extending outside of the pillars having a larger cross-sectional area than the pillars.

Accordingly, in some embodiments, a microelectronic device comprises a stack structure comprising tiers of alternating conductive structures and insulative structures, strings of memory cells extending through the stack structure, the strings of memory cells comprising at least a dielectric material and a channel material vertically extending through the stack structure, and a conductive contact structure in electrical communication with the channel material of a string of the strings of memory cells, the conductive contact structure having a larger cross-sectional area than the at least a dielectric material and the channel material of the string.

Accordingly, in some embodiments, a method of forming a microelectronic device comprises forming a first stack structure comprising alternating levels of insulative structures and other insulative structures, forming first pillars including a channel material extending through the first stack structure, forming a second stack structure comprising alternating levels of additional insulative structures and sacrificial structures over the first stack structure, forming second pillars through the second stack structure, the second pillars comprising an additional channel material vertically extending through the second pillars and in electrical communication with the channel material of the first pillars, forming an electrically conductive material in the second pillars, growing additional electrically conductive material over the second pillars to form electrically conductive contacts, and at least partially replacing the sacrificial structures with an electrically conductive material.

Figure 3:
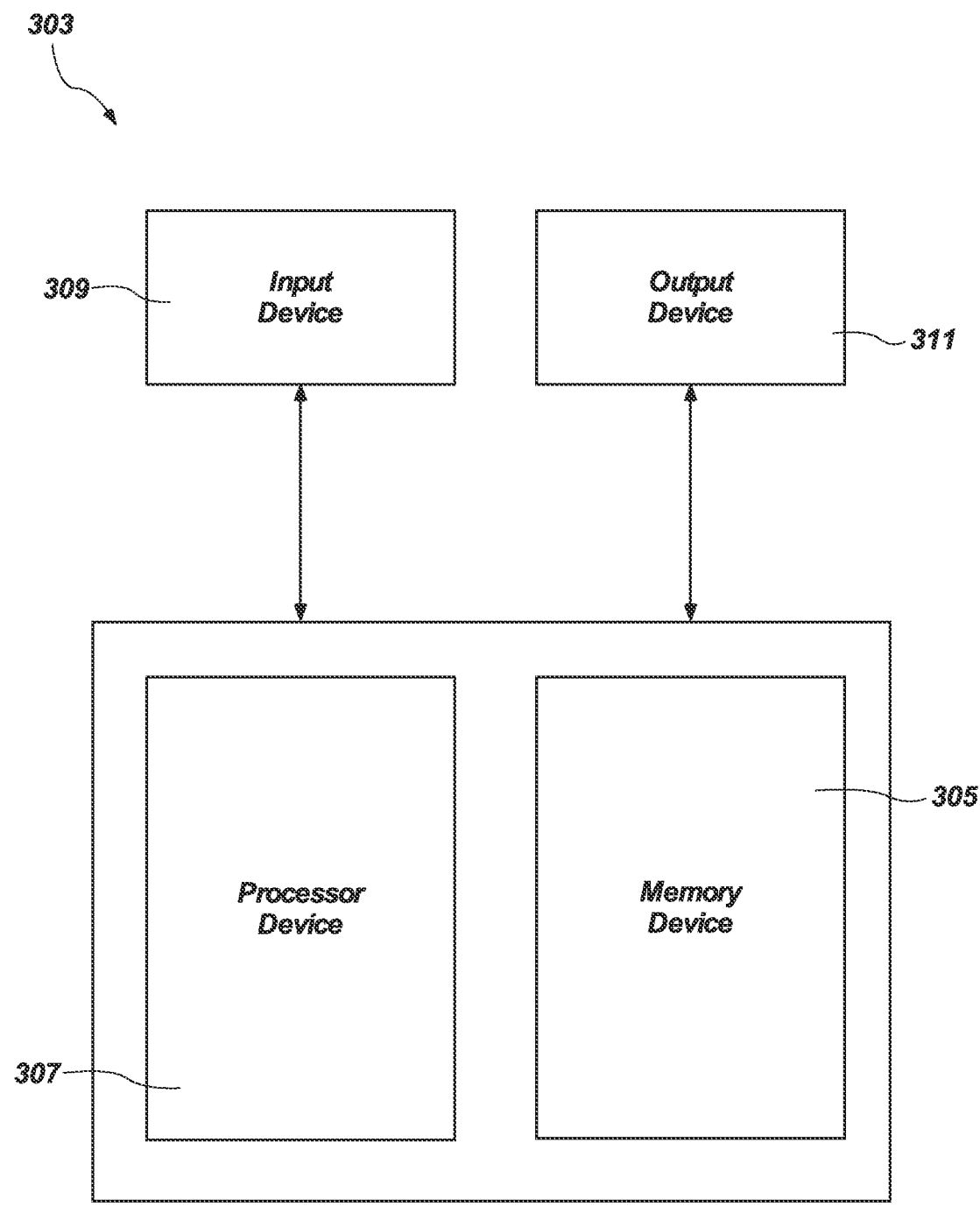
FIG. 3 is a block diagram of an electronic system, in accordance with embodiments of the disclosure.

Microelectronic devices including microelectronic devices (e.g., the microelectronic device 201) and microelectronic device structures (e.g., the microelectronic device structure 100, 200) including self-aligned contact structures 140 having an increased dimension with embodiments of the disclosure may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a microelectronic device structure previously described herein (e.g., the microelectronic device structure 100, 200) or a microelectronic device (e.g., the microelectronic device 201) previously described with reference to FIG. 1A through FIG. 1N and FIG. 2, including the self-aligned contact structures 140 having an increased dimension.

The electronic system 303 may further include at least one electronic signal processor device 307 (often referred to as a "microprocessor"). The electronic signal processor device 307 may, optionally, include an embodiment of a microelectronic device or a microelectronic device structure previously described herein (e.g., one or more of the microelectronic device 201 or the microelectronic device structure 100, 200 previously described with reference to FIG. 1A through FIG. 1N and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
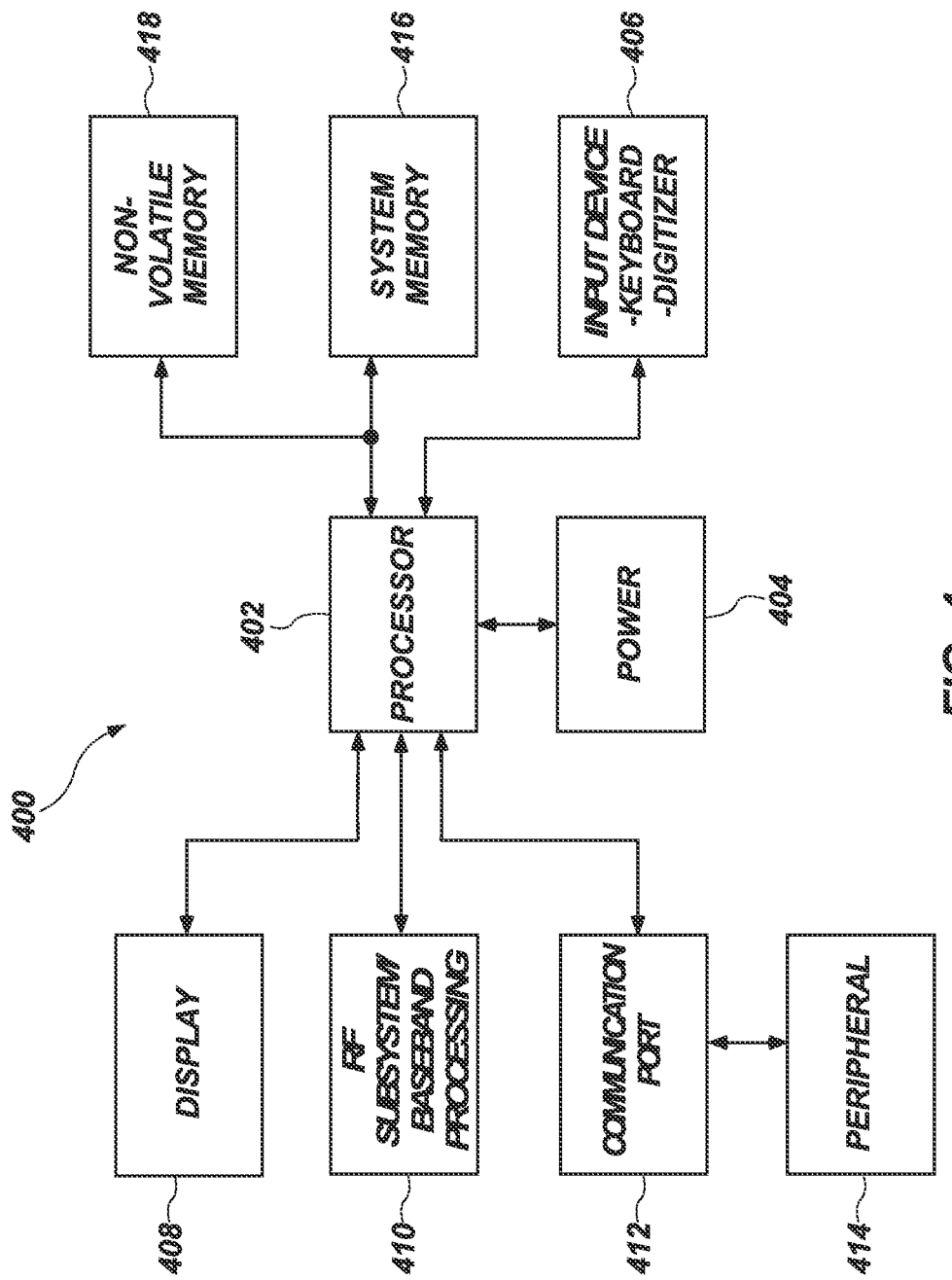
FIG. 4 is a processor-based system, in accordance with embodiments of the disclosure.

With reference to FIG. 4, depicted is a processor-based system 400. The processor-based system 400 may include various microelectronic devices and microelectronic device structures (e.g., microelectronic devices and microelectronic device structures including one or more of the microelectronic device 201 or the microelectronic device structure 100, 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include microelectronic devices and microelectronic device structures (e.g., microelectronic devices and microelectronic device structures including one or more of the microelectronic device 201 or the microelectronic device structure 100, 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the microelectronic devices and microelectronic device structures (e.g., the microelectronic device 201 and the microelectronic device structure 100, 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as the microelectronic devices and microelectronic device structures (e.g., the microelectronic device 201 and the microelectronic device structure 100, 200) described above, or a combination thereof.

Accordingly, in at least some embodiments, an electronic device comprises an input device, an output device, a processor device operably coupled to the input device and the output device, and a memory device operably coupled to the processor device and comprising at least one microelectronic device. The at least one microelectronic device comprises strings of memory cells extending through alternating levels of insulative structures and conductive structures, pillars within a stack structure comprising alternating levels of insulative structures and conductive structures, the pillars laterally aligned with the strings of memory cells, and conductive contact structures electrically connected to a channel material vertically extending through the strings of memory cells and the pillars, the conductive contact structures having a greater lateral dimension than the strings of memory cells.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a stack structure comprising alternating conductive structures and insulative structures arranged in tiers, each of the tiers individually comprising a conductive structure and an insulative structure, the conductive structures individually in contact with a conductive liner material;
   strings of memory cells vertically extending through the stack structure, the strings of memory cells comprising a channel material vertically extending through the stack structure;
   an other stack structure vertically overlying the stack structure and comprising alternating levels of other conductive structures and other insulative structures, the other conductive structures directly contacting the other insulative structures, the other stack structure comprising pillars vertically overlying the strings of memory cells, each pillar comprising another channel material in electrical communication with the channel material of the strings of memory cells;
   conductive contact structures vertically overlying the other stack structure, each conductive contact structure comprising an electrically conductive contact at least partially extending into the pillars and a portion extending outside of the pillars having a larger cross-sectional area than the pillars; and
   conductive lines vertically over the conductive contact structures and in electrical communication with the conductive contact structures.

2. The microelectronic device of claim 1, wherein the other conductive structures of the other stack structure comprise a different material composition than the conductive structures of the stack structure.

3. The microelectronic device of claim 1, wherein the conductive structures of the stack structure comprise a different material composition than the conductive contact structures.

4. The microelectronic device of claim 1, wherein the conductive contact structures comprise tungsten.

5. The microelectronic device of claim 1, further comprising an insulative material between at least two of the pillars horizontally adjacent each other and vertically extending into the other stack structure and terminating vertically above the stack structure.

6. The microelectronic device of claim 5, wherein about one half of each conductive contact structure overlies the insulative material vertically extending into the other stack structure.

7. The microelectronic device of claim 1, wherein the other conductive structures of the other stack structure comprise select gate structures.

8. The microelectronic device of claim 1, wherein at least one string of memory cells of the strings of memory cells is laterally offset from a nearest string of memory cells of the strings of memory cells in a first lateral direction and is laterally aligned with a nearest additional string of memory cells of the strings of memory cells in a second lateral direction.

9. The microelectronic device of claim 1, wherein about one half of each conductive contact structure is aligned with an insulative material extending into the other stack structure.

10. The microelectronic device of claim 1, wherein the other conductive structures and the conductive contact structures comprise substantially the same material composition, the conductive contact structures extending into lateral boundaries of the other conductive structures.

11. A method of forming a microelectronic device, the method comprising:
    forming a stack structure comprising alternating levels of insulative structures and other insulative structures;
    forming first pillars including a channel material extending through the stack structure;
    forming an other stack structure comprising alternating levels of other insulative structures and sacrificial structures over the stack structure;
    forming second pillars through the other stack structure, the second pillars comprising an additional channel material vertically extending through the second pillars and in electrical communication with the channel material of the first pillars;

forming an electrically conductive material in the second pillars;

growing additional electrically conductive material over the second pillars to form conductive contact structures;

at least partially replacing the sacrificial structures with a conductive material to form other conductive structures, the conductive contact structures vertically overlying the other stack structure, each of the conductive contact structures comprising an electrically conductive contact at least partially extending into the second pillars and a portion extending outside of the second pillars having a larger cross-sectional area than the second pillars;

removing the other insulative structures and forming conductive structures at locations corresponding to the other insulative structures to form:

the stack structure comprising alternating conductive structures and insulative structures arranged in tiers, each of the tiers individually comprising a conductive structure and an insulative structure, the conductive structures individually in contact with a conductive liner material; and strings of memory cells vertically extending through the stack structure, the strings of memory cells comprising the channel material vertically extending through the stack structure, the other stack structure vertically overlying the stack structure and comprising alternating levels of the other conductive structures and the other insulative structures, the other conductive structures directly contacting the other insulative structures, the other stack structure comprising the second pillars vertically overlying the strings of memory cells, each of the second pillars comprising the additional channel material in electrical communication with the channel material of the strings of memory cells; and forming conductive lines vertically over the conductive contact structures and in electrical communication with the conductive contact structures.

12. The method of claim 11, wherein forming an electrically conductive material in the second pillars comprises:

forming a sacrificial material in the second pillars; and replacing at least some of the sacrificial material in the second pillars with the electrically conductive material.

13. The method of claim 12, wherein replacing at least some of the sacrificial material in the second pillars with an electrically conductive material comprises converting polysilicon to tungsten.

14. The method of claim 12, wherein forming a sacrificial material in the second pillars comprises forming polysilicon in the second pillars.

15. The method of claim 12, wherein removing the other insulative structures and forming conductive structures at locations corresponding to the other insulative structures comprises removing the other insulative structures and forming the other conductive structures at locations corresponding to the other insulative structures after replacing the sacrificial structures with an electrically conductive material.

16. The method of claim 12, wherein removing the other insulative structures comprises:

forming a slot through the stack and the other stack; and exposing the insulative structures to a wet etchant through the slot.

17. The method of claim 11, wherein replacing the sacrificial structures with an electrically conductive material comprises converting sacrificial structures comprising polysilicon to an electrically conductive material comprising tungsten.

18. A microelectronic device, comprising:

a stack structure comprising tiers of alternating conductive structures and insulative structures, the conductive structures individually in contact with a conductive liner material;

strings of memory cells extending through the stack structure, the strings of memory cells comprising at least a dielectric material and a channel material vertically extending through the stack structure;

an other stack structure vertically overlying the stack structure and comprising alternating levels of other conductive structures and other insulative structures, the other conductive structures directly contacting the other insulative structures; and a conductive contact structure in electrical communication with the channel material of a string of the strings of memory cells, the conductive contact structure comprising a first portion extending into the stack structure and a second portion vertically above the stack structure and having a larger cross-sectional area than the at least a dielectric material and the channel material of the string, the first portion and the second portion comprising substantially the same material composition, the conductive contact structure comprising a different phase of tungsten than the conductive structures of the stack structure.

19. The microelectronic device of claim 18, wherein the conductive contact structure comprises a greater amount of β-phase tungsten than α-phase tungsten.

20. The microelectronic device of claim 18, further comprising a dielectric material extending through the stack structure and separating a first group of strings of memory cells from a second group of strings of memory cells.

21. The microelectronic device of claim 18, further comprising a conductive line vertically overlying the second portion, the second portion vertically between the first portion and the conductive line.

22. An electronic system, comprising:

an input device;

an output device;

a processor device operably coupled to the input device and the output device; and a memory device operably coupled to the processor device and comprising at least one microelectronic device structure, the at least one microelectronic device structure comprising:

strings of memory cells extending through alternating levels of insulative structures and conductive structures;

pillars within a stack structure vertically overlying the strings of memory cells and comprising alternating levels of other insulative structures and other conductive structures, the pillars laterally aligned with the strings of memory cells, the other conductive structures of the pillars comprising a different material composition than the conductive structures of the strings of memory cells;

conductive contact structures electrically connected to a channel material vertically extending through the strings of memory cells and the pillars, the conductive contact structures having a greater lateral dimension than the strings of memory cells in a first lateral direction and a second lateral direction, the conductive contact structures comprising a different material composition than the channel material, each of the conductive contact structures at least partially extending into the stack structure; and a select gate slot vertically extending through the alternating levels of the other insulative structures and the other conductive structures and terminating prior to the stack structure, the conductive contact structures laterally extending into lateral boundaries of the select gate slot.

23. The electronic system of claim 22, wherein the conductive contact structures individually comprise tungsten, greater than or equal to about 60 percent of the tungsten comprising β-phase tungsten.

* * * * *